United States Patent
Lim et al.

(10) Patent No.: US 9,728,463 B2
(45) Date of Patent: Aug. 8, 2017

(54) METHODS OF MANUFACTURING SEMICONDUCTOR DEVICES

(71) Applicant: Samsung Electronics Co., Ltd., Suwon-si, Gyeonggi-do (KR)

(72) Inventors: Ha-jin Lim, Seoul (KR); Gi-gwan Park, Suwon-si (KR); Sang-yub Ie, Yongin-si (KR); Jong-han Lee, Namyangju-si (KR); Jeong-hyuk Yim, Seoul (KR); Hye-ri Hong, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/209,093

(22) Filed: Jul. 13, 2016

(65) Prior Publication Data
US 2017/0062211 A1    Mar. 2, 2017

(30) Foreign Application Priority Data
Aug. 25, 2015  (KR) ......................... 10-2015-0119815

(51) Int. Cl.
*H01L 21/8234*  (2006.01)
*H01L 29/66*  (2006.01)
(Continued)

(52) U.S. Cl.
CPC ................ *H01L 21/823462* (2013.01); *H01L 21/02123* (2013.01); *H01L 21/02271* (2013.01);
(Continued)

(58) Field of Classification Search
CPC ......... H01L 21/02362; H01L 21/02123; H01L 21/02271; H01L 21/02348;
(Continued)

(56) References Cited

U.S. PATENT DOCUMENTS

| 6,118,146 A | 9/2000 | Park et al. |
| 6,348,373 B1 | 2/2002 | Ma et al. |

(Continued)

FOREIGN PATENT DOCUMENTS

| JP | 2008-112762 | 5/2008 |
| KR | 100172727 | 10/1998 |
| KR | 100680970 | 2/2007 |

OTHER PUBLICATIONS

Hu et al. "Hot-Electron-Induced MOSFET Degradation-Model, Monitor, and Improvement" *IEEE Transactions on Electron Devices*, ED32 (2), Feb. 1985, pp. 375-385.
(Continued)

*Primary Examiner* — Fei Fei Yeung Lopez
(74) *Attorney, Agent, or Firm* — Myers Bigel, P.A.

(57) ABSTRACT

Methods of manufacturing a semiconductor device are provided. The methods may include forming a fin-type active region protruding from a substrate and forming a gate insulating film covering a top surface and both sidewalls of the fin-type active region. The gate insulating film may include a high-k dielectric film. The methods may also include forming a metal-containing layer on the gate insulating film, forming a silicon capping layer containing hydrogen atoms on the metal-containing layer, removing a portion of the hydrogen atoms contained in the silicon capping layer, removing the silicon capping layer and at least a portion of the metal-containing layer, and forming a gate electrode on the gate insulating film. The gate electrode may cover the top surface and the both sidewalls of the fin-type active region.

20 Claims, 39 Drawing Sheets

(51) Int. Cl.
H01L 21/02 (2006.01)
H01L 21/67 (2006.01)

(52) U.S. Cl.
CPC .. H01L 21/02318 (2013.01); H01L 21/02348 (2013.01); H01L 21/02356 (2013.01); H01L 21/02362 (2013.01); H01L 21/67207 (2013.01); H01L 29/66795 (2013.01)

(58) Field of Classification Search
CPC ......... H01L 21/02356; H01L 29/66795; H01L 21/823462
See application file for complete search history.

(56) References Cited

U.S. PATENT DOCUMENTS

| | | |
|---|---|---|
| 7,135,361 B2 | 11/2006 | Visokay et al. |
| 7,422,936 B2 | 9/2008 | Barns et al. |
| 8,502,286 B2 | 8/2013 | Lim et al. |
| 8,569,137 B1 | 10/2013 | Zhou |
| 8,691,643 B2 | 4/2014 | Kim et al. |
| 8,785,267 B2 | 7/2014 | Baek et al. |
| 2007/0210421 A1 | 9/2007 | Bu et al. |
| 2008/0242012 A1* | 10/2008 | Pae .................. H01L 21/28079 438/197 |
| 2009/0289284 A1 | 11/2009 | Goh et al. |

OTHER PUBLICATIONS

Budini et al. "Influence of microstructure and hydrogen concentration on amorphous silicon crystallization" Thin Solid Films, 518, 2010, pp. 5349-5354.

* cited by examiner

B - B'

C - C'

METHODS OF MANUFACTURING SEMICONDUCTOR DEVICES

CROSS-REFERENCE TO RELATED APPLICATION

This application claims priority under 35 U.S.C. §119 to Korean Patent Application No. 10-2015-0119815, filed on Aug. 25, 2015, in the Korean Intellectual Property Office, the disclosure of which is incorporated by reference herein in its entirety.

BACKGROUND

The inventive concept relates to methods of manufacturing a semiconductor device and, more particularly, to methods of manufacturing a semiconductor device including a high-k dielectric layer in a gate insulating film.

Due to the development of electronic technology, the downscaling of semiconductor devices has lately progressed at high speed. In recent years, semiconductor devices have required not only high operating speeds but also operational accuracy. Accordingly, a vast amount of research has been conducted on controlling characteristics of semiconductor devices and improving reliability thereof.

SUMMARY

The inventive concept provides methods of manufacturing a semiconductor device, which may control characteristics of the semiconductor device and improve reliability.

The inventive concept also provides methods of manufacturing a semiconductor device having a fin-type active region, which may control characteristics of the semiconductor device and improve reliability.

A method of manufacturing a semiconductor device may include forming a fin-type active region protruding from a substrate, forming a gate insulating film on a top surface and both sidewalls of the fin-type active region, the gate insulating film including a high-k dielectric film, forming a metal-containing layer on the gate insulating film, forming a silicon capping layer including hydrogen atoms on the metal-containing layer, removing a portion of the hydrogen atoms in the silicon capping layer from the silicon capping layer, removing the silicon capping layer and at least a portion of the metal-containing layer and forming a gate electrode on the gate insulating film, the gate electrode extending on the top surface and the both sidewalls of the fin-type active region.

According to various embodiments, the removing the portion of the hydrogen atoms in the silicon capping layer may include exposing the silicon capping layer to ultraviolet (UV) light.

In various embodiments, the forming of the silicon capping layer and the exposing of the silicon capping layer to the UV light may be performed while maintaining a vacuum atmosphere.

In various embodiments, the UV light may have a wavelength of about 280 nm to about 380 nm.

According to various embodiments, the forming of the silicon capping layer may include forming the silicon capping layer in an amorphous phase. The method may further include performing a rapid thermal annealing (RTA) process to covert the silicon capping layer in the amorphous phase into the silicon capping layer in a polycrystalline phase after the forming of the silicon capping layer.

According to various embodiments, the RTA process may be performed before the silicon capping layer is exposed to the UV light.

In various embodiments, the RTA process may be performed after the silicon capping layer is exposed to the UV light.

In various embodiments, the exposing of the silicon capping layer to the UV light may be performed in an atmosphere of a first temperature. The performing of the RTA process may include applying heat to the substrate at a second temperature higher than the first temperature.

According to various embodiments, the first temperature may range from about 300° C. to about 600° C.

According to various embodiments, the second temperature may range from about 800° C. to about 1200° C.

In various embodiments, the exposing of the silicon capping layer to the UV light may be performed for a first time duration. The performing of the RTA process may include performing a thermal treatment for a second time duration that is shorter than the first time duration.

According to various embodiments, the first time duration may range from several minutes to several tens of minutes.

According to various embodiments, the second time duration may range from several seconds to several tens of seconds.

In various embodiments, the forming of the silicon capping layer, the exposing of the silicon capping layer to the UV light, and the RTA process may be performed while maintaining a vacuum atmosphere.

According to various embodiments, the method may also include exposing the metal-containing layer to an oxygen-containing atmosphere to oxidize at least a portion of the metal-containing layer before the forming of the silicon capping layer.

In various embodiments, the oxygen-containing atmosphere may be an air atmosphere, a moisture atmosphere, an oxygen atmosphere, or an ozone atmosphere.

In various embodiments, the forming of the silicon capping layer may be performed using a low-pressure chemical vapor deposition (LPCVD) process.

According to various embodiments, the silicon capping layer may be formed by a process using a silicon precursor including hydrogen atoms or using both hydrogen molecules and a silicon precursor.

A method of manufacturing a semiconductor may include preparing a substrate on which a gate insulating film including a high-k dielectric film and a metal-containing layer are sequentially formed. At least a portion of the metal-containing layer may be oxidized. The method may further include transferring the substrate into a process system including a first chamber and a second chamber. A vacuum atmosphere may be provided in the process system. The method may also include transferring the substrate into the first chamber of the process system to form a silicon capping layer including hydrogen atoms on the metal-containing layer in the first chamber and transferring the substrate from the first chamber of the process system into the second chamber of the process system, without transferring the substrate out of the process system, to remove a portion of the hydrogen atoms in the silicon capping layer in the second chamber.

According to various embodiments, after the substrate is transferred into the first chamber, the vacuum atmosphere may be maintained in the process system until the removing of the portion of the hydrogen atoms in the silicon capping layer is completed.

In various embodiments, the first chamber may be a low-pressure chemical vapor deposition (LPCVD) chamber, and the silicon capping layer may be formed using a silicon precursor including hydrogen atoms or using both hydrogen molecules and a silicon precursor.

In various embodiments, the second chamber is a ultraviolet (UV) chamber, and the removing of the portion of the hydrogen atoms in the silicon capping layer may include exposing the silicon capping layer to UV light having a wavelength of about 280 nm to about 380 nm.

According to various embodiments, the process system further may include a third chamber, and the method may further include transferring the substrate from the second chamber of the process system into the third chamber of the process system, without transferring the substrate out of the process system, and performing a rapid thermal annealing (RTA) process to diffuse oxygen atoms in the metal-containing layer into the high-k dielectric film in the third chamber after the forming of the silicon capping layer or after the removing of the portion of the hydrogen atoms in the silicon capping layer.

According to various embodiments, the exposing of the silicon capping layer to the UV light may be performed for a first time duration in an atmosphere of a first temperature, and the performing of the RTA process may include applying heat to the substrate at a second temperature that may be higher than the first temperature for a second time duration that may be shorter than the first time duration.

A method of manufacturing a semiconductor device may include preparing a substrate on which a gate insulating film including a high-k dielectric film is formed and forming a metal-containing layer on the gate insulating film. At least a portion of the metal-containing layer may be oxidized. The method may further include forming a silicon capping layer including hydrogen atoms on the metal-containing layer, removing a portion of the hydrogen atoms in the silicon capping layer from the silicon capping layer, performing a rapid thermal annealing (RTA) process to crystallize the silicon capping layer and diffuse a portion of oxygen atoms in the metal-containing layer into the gate insulating film and removing the silicon capping layer and at least a portion of the metal-containing layer.

In various embodiments, the forming of the silicon capping layer and the removing the portion of the hydrogen atoms in the silicon capping layer may be performed while maintaining a vacuum atmosphere without a vacuum break.

According to various embodiments, the forming of the silicon capping layer, the removing of the portion of the hydrogen atoms in the silicon capping layer, and the RTA process may be performed while maintaining the vacuum atmosphere.

According to various embodiments, the preparing of the substrate on which the gate insulating film is formed may include forming a fin-type active region protruding from the substrate and forming an interface layer on the fin-type active region and forming the high-k dielectric film on the interface layer. The high-k dielectric film has a higher relative dielectric constant than the interface layer.

In various embodiments, the forming of the fin-type active region may include partially etching the substrate to form a preliminary fin-type active region and forming a device isolation layer on lower portions of both sidewalls of the preliminary fin-type active region such that an upper portion of the preliminary fin-type active region protrudes from the device isolation layer.

According to various embodiments, the forming of the silicon capping layer may be performed by a low-pressure chemical vapor deposition (LPCVD) process using a silicon precursor including hydrogen atoms or using both hydrogen molecules and a silicon precursor. The removing of the portion of the hydrogen atoms in the silicon capping layer may include exposing the silicon capping layer to ultraviolet (UV) light.

A method of manufacturing a semiconductor device may include forming a gate insulating film on a substrate, and the gate insulating film may include a high-k dielectric film. The method may also include forming a metal layer on the gate insulating film, and the metal layer may include oxygen or nitrogen. The method may further include forming a capping layer on the metal layer, performing an anneal process to diffuse a portion of the oxygen or a portion of the nitrogen in the metal layer into the high-k dielectric film and forming a gate electrode on the gate insulating film after performing the anneal process.

In various embodiments, the anneal process may be performed at a temperature that ranges from about 800° C. to about 1200° C.

According to various embodiments, the capping layer may include hydrogen, and the method further may include exposing the capping layer to UV light to at least partially remove the hydrogen in the capping layer before or after performing the anneal process.

According to various embodiments, exposing the capping layer to the UV light may be performed at a temperature that ranges from about 300° C. to about 600° C.

In various embodiments, forming the metal layer may include forming a preliminary metal layer on the gate insulating film and exposing the preliminary metal layer to oxygen or nitrogen to form the metal layer including the oxygen or the nitrogen.

According to various embodiments, the method may also include removing the capping layer and a portion of the metal layer after performing the anneal process. Forming the gate electrode may include forming the gate electrode on a remaining portion of the metal layer such that the remaining portion of the metal layer is between the gate insulating film and the gate electrode.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1A:
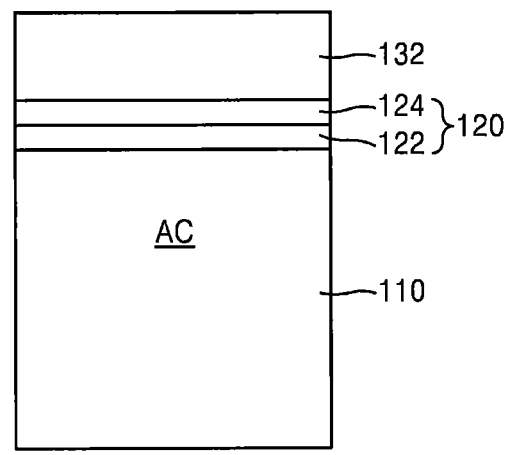
FIGS. 1A through 1G are cross-sectional views illustrating a method of manufacturing a semiconductor device according to example embodiments.
Figure 1A:
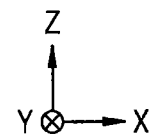

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which example embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions may be exaggerated for clarity, and proportions of respective components may be exaggerated or reduced. Like numbers refer to like elements throughout.

It will be understood that when an element or layer is referred to as being "on," "connected to," or "in contact with" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. When a term "substrate" is used herein, it may refer to either the substrate itself or both the substrate and a stack structure including a predetermined substrate or film formed on the substrate. Also, when an expression "surface of the substrate" is used herein, it may refer to either as an exposed surface of the substrate itself or an outer surface of a predetermined substrate or film formed on the substrate.

Unless otherwise defined, all terms (including technical and scientific terms) used herein have the same meaning as commonly understood by one of ordinary skill in the art to which this inventive concept belongs.

The inventive concept will now be described more fully hereinafter with reference to the accompanying drawings, in which example embodiments of the inventive concept are shown.

FIGS. 1A through 1G are cross-sectional views illustrating a method of manufacturing a semiconductor device according to example embodiments.

Referring to FIG. 1A, a substrate 110 including an active region AC may be prepared, and a gate insulating film 120 and a first metal-containing layer 132 may be sequentially formed on the active region AC.

The substrate 110 may include at least one of a Group III-V material and/or a Group IV material. The substrate 110 may include, for example, a semiconductor (e.g., silicon (Si) or germanium (Ge)) or a compound semiconductor (e.g., silicon germanium (SiGe), silicon carbide (SiC), gallium arsenide (GaAs), indium arsenide (InAs), and indium phosphide (InP)). The Group III-V material may be a binary compound, ternary compound, or quaternary compound including at least one Group III element and at least one Group V element. The Group III-V material may be a compound including at least one Group III element and at least one Group V element. The at least one Group III element may be one element of indium (In), gallium (Ga), and aluminum (Al), and the at least one Group V element may be one element of arsenic (As), phosphorus (P), and tin (Sb). For example, the Group III-V material may be selected from InP, $In_zGa_{1-z}As$ (0≤z≤1) and $Al_zGa_{1-z}As$ (0≤z≤1). The binary compound may be, for example, one of InP, GaAs, InAs, InSb, and GaSb. The ternary compound may be one of InGaP, InGaAs, AlInAs, InGaSb, GaAsSb, and GaAsP. The Group IV material may be silicon (Si) or germanium (Ge). However, a Group III-V material and a Group IV material, which may be used in the semiconductor device according to the present embodiment, are not limited to the above-described examples. The Group III-V material and the Group IV material (e.g., germanium) may be used as materials for forming channels of low-power high-speed transistors.

A highly efficient CMOS device may be formed by using a semiconductor substrate including a Group III-V material (e.g., GaAs) having a higher electron mobility than a silicon substrate and a semiconductor substrate including a semiconductor material (e.g., germanium) having a higher hole mobility than the silicon substrate. In some embodiments, when an NMOS transistor is formed on the substrate 110, the substrate 110 may include one of the above-described Group III-V materials. In some embodiments, when a PMOS transistor is formed on the substrate 110, at least a portion of the substrate 110 may include germanium. In some embodiments, the substrate 110 may have a silicon-on-insulator (SOI) structure. In some embodiments, the substrate 110 may include a buried oxide (BOX) layer. The substrate 110 may include a conductive region, for example, a doped well or a doped structure. In addition, the substrate 110 may include one of various device isolation structures, such as a shallow trench isolation (STI) structure and a deep trench isolation (DTI) structure.

Although the substrate 110 is illustrated as having a planar shape, only a minute portion of the substrate 110 is illustrated, and a shape of the substrate 110 is not limited thereto. For example, the substrate 110 may have various shapes that may include a channel region of a transistor included in a semiconductor device.

A gate insulating film 120 may be formed on the substrate 110. The gate insulating film 120 may include silicon oxide, silicon nitride, silicon oxynitride, gallium oxide, germanium oxide, a high-k dielectric material, or a combination thereof.

The gate insulating film 120 may include an interface layer 122 having a first relative dielectric constant and a high-k dielectric film 124 that is formed on the interface layer 122 and has a second relative dielectric constant that is higher than the first relative dielectric constant.

The interface layer 122 may include a dielectric material having a relative dielectric constant of about 9 or less, for example, silicon oxide, silicon nitride, silicon oxynitride, gallium oxide, or germanium oxide, but the inventive concept is not limited thereto. The interface layer 122 may include an oxide, a nitride, or an oxynitride of a material included in the substrate 110. The interface layer 122 may have a thickness of, for example, about 5 Å to about 20 Å, but the inventive concept is not limited thereto. The interface layer 122 may be formed by using, for example, a thermal oxidation process, an atomic layer deposition (ALD) process, a chemical vapor deposition (CVD) process, or a physical vapor deposition (PVD) process.

The high-k dielectric film 124 may include a high-k dielectric material having a relative dielectric constant of about 10 to about 25 that is higher than a relative dielectric constant of the interface layer 122. The high-k dielectric film 124 may include, for example, a material having a higher relative dielectric constant than a silicon oxide film and a silicon nitride film. The high-k dielectric film 124 may include a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof, but a material included in the high-k dielectric film 124 is not limited thereto. The high-k dielectric film 124 may be formed by using, for example, an ALD process, a CVD process, or a PVD process. The high-k dielectric film 124 may have a thickness of, for example, about 10 Å to about 40 Å, but the inventive concept is not limited thereto.

Although the gate insulating film 120 is illustrated as having a planar shape, only a minute portion of the gate insulating film 120 is illustrated, and a shape of the gate insulating film 120 is not limited thereto. For example, the gate insulating film 120 may have various shapes that may include a gate insulating film of a transistor included in a semiconductor device. For example, both the interface layer 122 and the high-k dielectric film 124 or only the high-k dielectric film 124 may protrude from a top surface of the substrate 110.

A first metal-containing layer 132 may be formed on the gate insulating film 120. The first metal-containing layer 132 may include, for example, a metal, a metal nitride, or a metal carbide. The first metal-containing layer 132 may include a material selected from the group consisting of titanium nitride (TiN), tantalum nitride (TaN), tungsten (W), titanium aluminum carbide (TiAlC), tantalum aluminum carbide (TaAlC), tantalum aluminide (TaAl), titanium aluminide (TiAl), hafnium aluminide (HfAl), aluminum (Al), titanium (Ti), tungsten nitride (WN), ruthenium (Ru), molybdenum (Mo), and a combination thereof, but a material included in the first metal-containing layer 132 is not limited thereto. The first metal-containing layer 132 may have a thickness of, for example, about several tens of Å to several hundred Å, but the inventive concept is not limited thereto.

Although the first metal-containing layer 132 is illustrated as having a planar shape, only a portion of the first metal-containing layer 132 is illustrated, and a shape of the first metal-containing layer 132 is not limited thereto. For example, when both the interface layer 122 and the high-k dielectric film 124 or only the high-k dielectric film 124 has a structure protruding from the top surface of the substrate 110, the first metal-containing layer 132 may entirely or partially fill a space defined by the protruding structure.

Figure 1B:
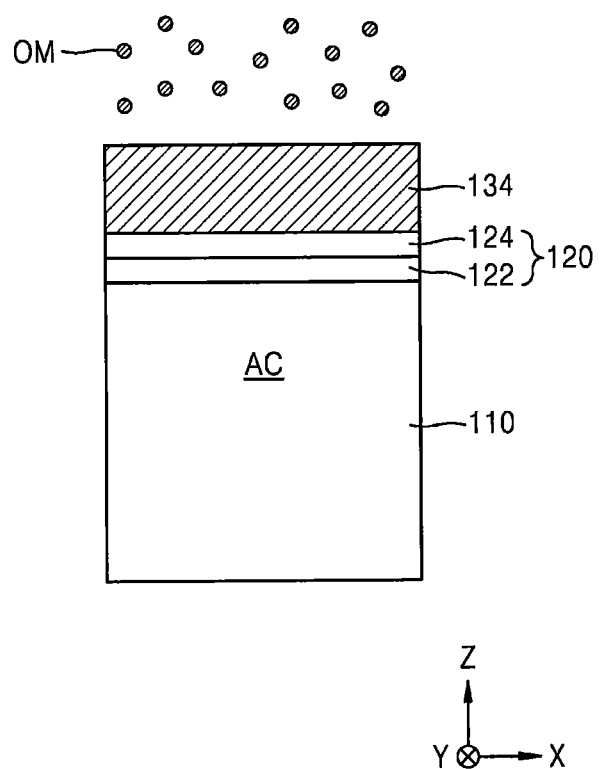

Referring to FIGS. 1A and 1B, the substrate 110 on which the first metal-containing layer 132 is formed may be exposed to an oxygen-containing atmosphere, that is, an atmosphere including oxygen-containing gas molecules OM. The oxygen-containing atmosphere may be, for example, an air atmosphere, a moisture atmosphere, an oxygen atmosphere, or an ozone atmosphere. The oxygen-containing gas molecules OM may be, for example, oxygen molecules, water molecules, or ozone molecules.

At least a portion of the first metal-containing layer 132 exposed to the oxygen-containing atmosphere may be oxidized to form a second metal-containing layer 134 including oxygen. When the first metal-containing layer 132 includes a metal, a metal nitride, or a metal carbide, at least a portion of the second metal-containing layer 134 may include an oxidized metal, an oxidized metal nitride, or an oxidized metal carbide.

In some embodiments, when the first metal-containing layer 132 includes a metal or a metal carbide, the substrate 110 on which the first metal-containing layer 132 is formed may be exposed to an atmosphere containing (e.g., including) gas molecules containing (e.g., including) nitrogen instead of oxygen so that at least a portion of the first metal-containing layer 132 may be nitrided to form a second metal-containing layer 134 including nitrogen.

Figure 1C:
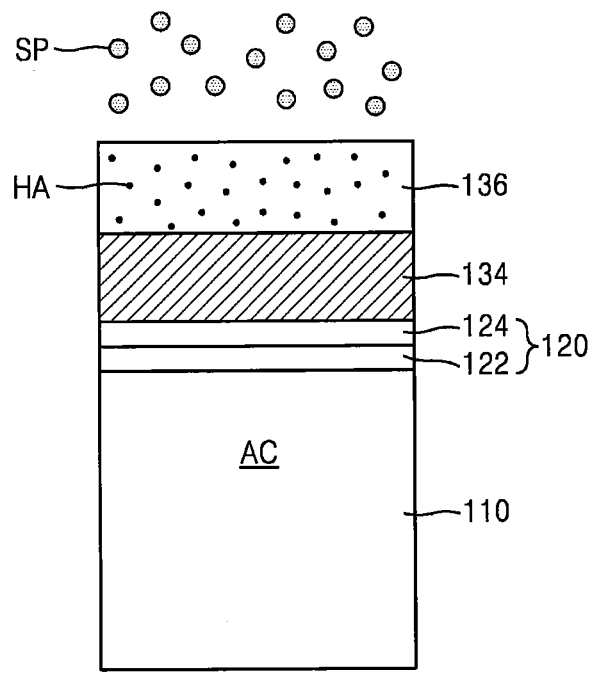
Figure 1D:
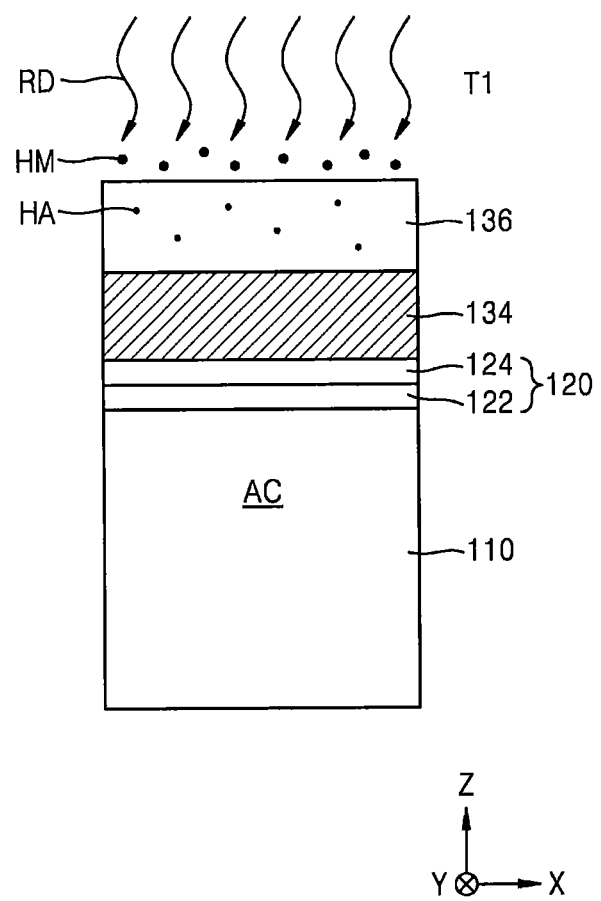
Figure 1E:
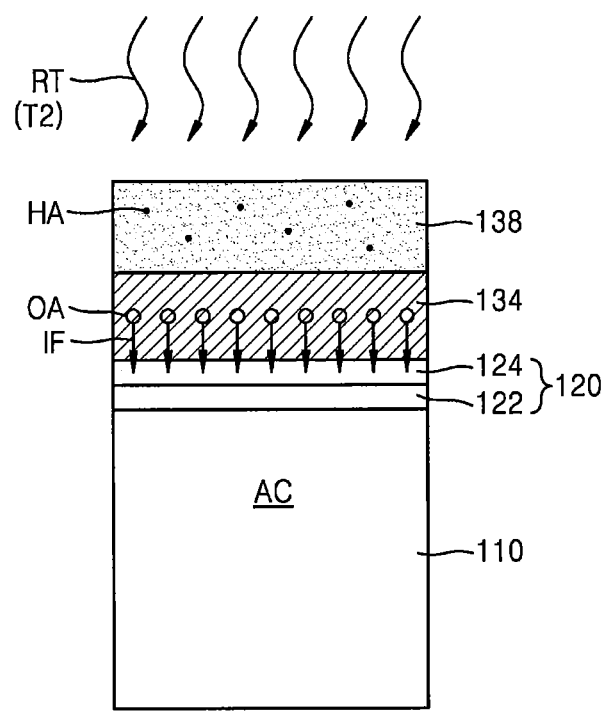

Oxygen atoms included in the second metal-containing layer 134 formed by oxidizing at least the portion of the first metal-containing layer 132 or nitrogen atoms included in the second metal-containing layer 134 formed by nitriding at least the portion of the first metal-containing layer 132 will be referred to as curing atoms (e.g., OA in FIG. 1E).

Referring to FIG. 1C, a silicon capping layer 136 may be formed on the second metal-containing layer 134. The silicon capping layer 136 may include, for example, amorphous silicon (a-Si). The silicon capping layer 136 may contain hydrogen (e.g., hydrogen atoms HA). The silicon capping layer 136 may have a thickness of, for example, about several tens of Å to about several hundred Å, but the inventive concept is not limited thereto. The silicon capping layer 136 may be formed by a low-pressure chemical vapor deposition (LPCVD) process using a silicon precursor SP containing hydrogen atoms or using both hydrogen molecules H2 and a silicon precursor SP.

The silicon precursor SP may contain hydrogen atoms and may be, for example, $SiH_4$, $Si_2H_6$, $SiH_2Cl_2$, $SiHCl_3$, $CH_3SiH_2Cl$, $CH_3SiHCl_2$, $CH_3SiCl_3$, $(CH_3)_2SiCl_2$, $(CH_3)_3SiCl$, $(CH_3)_4Si$, $C_2H_5SiCl_3$, $(C_2H_5)_2SiCl_2$, $(C_2H_5)_3SiCl$, $CH_3C_6H_5SiCl_2$, $C_6H_5SiCl_3$, $(C_6H_5)_2SiCl_2$, and/or $(C_6H_5)_3SiCl$. Alternatively, the silicon precursor SP may be used along with hydrogen molecules in the form of, for example, $SiH_4$—$H_2$, $SiCl_4$—$H_2$, and/or $SiHCl_3$—$H_2$. Since the silicon capping layer 136 is formed by using the silicon precursor SP containing the hydrogen atoms or using both the hydrogen molecules H2 and the silicon precursor SP, hydrogen (e.g., hydrogen atoms HA) may be contained in the silicon capping layer 136.

Referring to FIG. 1D, the hydrogen atoms HA contained in the silicon capping layer 136 may be at least partially removed in an atmosphere of a first temperature T1. For example, the silicon capping layer 136 may be exposed to UV radiant rays RD (e.g., ultraviolet light) in the atmosphere of the first temperature T1 so that a portion of the hydrogen atoms HA contained in the silicon capping layer 136 may be removed. The first temperature T1 may range from, for example, about 300° C. to about 600° C. The UV radiant rays RD may have a wavelength of, for example, about 380 nm or less.

A silicon-hydrogen (Si—H) bond may have a bonding force of about 3.3 eV. Thus, the Si—H bond may be dissociated due to UV radiant rays RD having a wavelength of about 380 nm or less. When the silicon capping layer 136 is exposed to UV radiant rays RD for a first time duration of several minutes to several tens of minutes, hydrogen atoms dissociated from silicon may diffuse in the atmosphere of the first temperature T1, may combine with dissociated hydrogen atoms and may be emitted as hydrogen molecules HM. Thus, the hydrogen atoms HA contained in the silicon capping layer 136 may be at least partially removed from the silicon capping layer 136.

To control characteristics of the semiconductor device or to improve reliability of the semiconductor device, hydrogen atoms may be intentionally combined in a layer or an interface between layers of the semiconductor device. Since Si—H bonds have a relatively low bonding force, only the Si—H bonds may be selectively dissociated when the semiconductor device is exposed to the UV radiant rays RD having a specific wavelength. The UV radiant rays RD may have a wavelength of, for example, about 280 nm to about 380 nm. In this case, only the hydrogen atoms HA contained in the silicon capping layer 136 may be selectively dissociated without dissociating bonds having a relatively high bonding force.

When the silicon capping layer 136 contains an excessively large quantity of hydrogen atoms HA, the hydrogen atoms HA may diffuse other elements (e.g., the gate insulating film 120) of the semiconductor device to deteriorate reliability. Accordingly, when the hydrogen atoms HA contained in the silicon capping layer 136 are at least partially removed, reliability deterioration may be reduced or possibly prevented.

In some embodiments, the hydrogen atoms HA may not be completely removed from the silicon capping layer 136, but a portion of hydrogen atoms HA may remain in the silicon capping layer 136.

Referring to FIGS. 1C and 1D, the process of forming the silicon capping layer 136 and the process of exposing the silicon capping layer 136 to the UV radiant rays RD may be performed while maintaining a vacuum atmosphere without a vacuum break. In this case, diffusion of the hydrogen atoms HA contained in the silicon capping layer 136 into other elements, for example, the gate insulating film 120, may be minimized, and a native silicon oxide film may not be formed on the silicon capping layer 136. Thus, the hydrogen molecules HM may be easily emitted from the silicon capping layer 136.

For example, a process system to which a vacuum atmosphere is provided may have a plurality of process chambers, and the process of forming the silicon capping layer 136 and the process of exposing the silicon capping layer 136 to the UV radiant rays RD may be performed in respectively corresponding chambers of the process system while maintaining the vacuum atmosphere without transferring the substrate 110 out of the process system.

Referring to FIGS. 1D and 1E, an anneal process (e.g., a rapid thermal annealing (RTA) process) may be performed on the substrate 110 on which the silicon capping layer 136 is formed. For example, when heat RT of a second temperature T2 is applied to the silicon capping layer 136 for a second time duration due to the RTA process, the silicon capping layer 136, which is in an amorphous phase, may be changed into a silicon capping layer 138, which is in a polycrystalline phase. The second temperature T2 may be higher than the first temperature T1. The second temperature T2 may range from, for example, about 800° C. to about 1200° C. The second time duration may be shorter than the first time duration. The second time duration may range from, for example, several seconds to several tens of seconds. The second time duration may not be a continuous time duration but a sum of time durations for which heat RT of the second temperature T2 is applied as a pulse. The RTA process may include a thermal treatment using a lamp and/or a thermal treatment using a laser.

In addition, when heat RT of the second temperature T2 is applied to the substrate 110 using the RTA process, the curing atoms OA contained in the second metal-containing layer 134 may flow (IF) into the gate insulating film 120. The curing atoms OA may be, for example, oxygen atoms or nitrogen atoms.

When the gate insulating film 120 contains oxygen atoms or nitrogen atoms, the gate insulating film 120 may have defects, such as oxygen vacancy or nitrogen vacancy. The curing atoms OA, which have flowed (IF) into the gate insulating film 120 may eliminate the defects, such as oxygen vacancy or nitrogen vacancy.

When the high-k dielectric film 124 has a relative dielectric constant higher than that of the interface layer 122, the high-k dielectric films 124 may have more defects than the interface layer 122. Accordingly, the curing atoms OA may mostly flow (IF) into the high-k dielectric film 124 and eliminate defects, such as oxygen vacancy or nitrogen vacancy.

Referring to FIGS. 1C to 1E, the process of forming the silicon capping layer 136, the process of exposing the silicon capping layer 136 to UV radiant rays RD, and the process of performing an RTA process on the substrate 110 on which the silicon capping layer 136 is formed may be performed while a vacuum atmosphere is maintained.

For example, a process system to which a vacuum atmosphere is provided may have a plurality of chambers, and the process of forming the silicon capping layer 136, the process of exposing the silicon capping layer 136 to the UV radiant rays RD, and the performing of the RTA process on the substrate 110 on which the silicon capping layer 136 is formed may be performed in respectively corresponding chambers of the process system while maintaining the vacuum atmosphere without transferring the substrate 110 out of the process system.

Figure 1F:
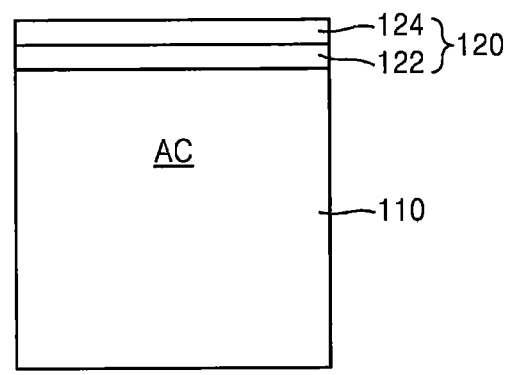
Figure 1F:
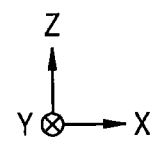

Referring to FIGS. 1E and 1F, the silicon capping layer 138 and the second metal-containing layer 134 may be removed to expose the gate insulating film 120. The silicon capping layer 138 and the second metal-containing layer 134 may be removed by using a dry etching process and/or a wet etching process.

When relatively many hydrogen atoms HA are contained in the silicon capping layer 138, the silicon capping layer 138, which is in a polycrystalline phase, may be crystallized to a relatively large extent. In this case, an etch rate may be comparatively reduced on a crystallized surface (e.g., a plane (111)) during the removal of the silicon capping layer 138 so that a portion of the silicon capping layer 138 may not be removed. That is, an unstrip phenomenon of the silicon capping layer 138 may occur. However, hydrogen atoms HA contained in the silicon capping layer 138 according to example embodiments may be at least partially removed, thereby reducing or possibly preventing occurrence of an unstrip phenomenon of the silicon capping layer 138.

In some embodiments, the silicon capping layer 138 may be entirely removed, and only a portion of the second metal-containing layer 134 may be removed not to expose the gate insulating film 120. The remaining portion of the second metal-containing layer 134 may be left on the gate insulating film 120.

Figure 1G:
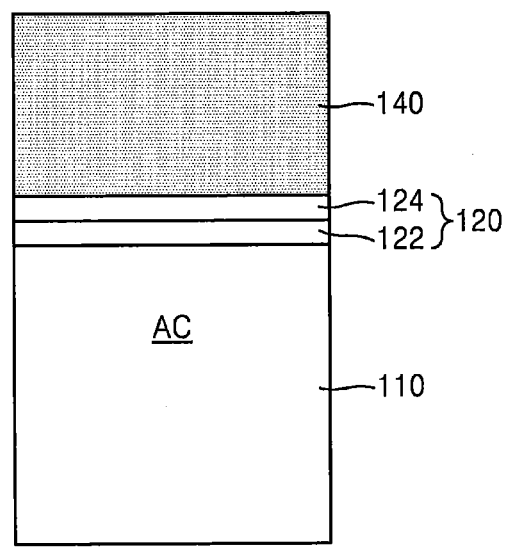

Referring to FIG. 1G, a semiconductor device 100 may be formed by forming a gate electrode 140 on the gate insulating film 120. The gate electrode 140 may include, for example, at least one metal selected from the group consisting of Ti, Ta, Al, W, Ru, Nb, Mo, Hf, Ni, Co, Pt, Yb, Tb, Dy, Er, and Pd, a metal nitride containing the at least one metal, or a metal compound, such as a carbon-doped metal or a carbon-doped metal nitride.

The gate electrode 140 may include a single layer or a multilayered structure including a plurality of layers. The gate electrode 140 may include, for example, a metal-containing layer for controlling a work function and a gap-fill metal-containing layer filling a space formed on the metal-containing layer for controlling the work function. In some embodiments, the gate electrode 140 may include a structure including a metal nitride layer, a metal layer, a conductive capping layer, and a gap-fill metal layer stacked sequentially. Each of the metal nitride layer and the metal layer may include at least one metal selected from the group consisting of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). Each of the metal nitride layer and the metal layer may be formed by using, for example, an ALD process, a metal organic ALD (MOALD) process, or a metal organic CVD (MOCVD) process. The conductive capping layer may serve as a protection layer to reduce or possibly prevent oxidation of a surface of the metal layer. Also, the conductive capping layer may serve as a wetting layer capable of facilitating deposition of another conductive layer on the metal layer. The conductive capping layer may include a metal nitride, for example, TiN, TaN, or a combination thereof, but the inventive concept is not limited thereto. The gap-fill metal layer may extend on the conductive capping layer. The gap-fill metal layer may include, for example, a tungsten (W) layer. The gap-fill metal layer may be formed by using, for example, an ALD process, a CVD process, or a PVD process. In some embodiments, the gap-fill metal layer may fill a recess space formed due to a stepped portion between regions on a top surface of the conductive capping layer without causing a void. In some embodiments, the gate electrode 140 may include a stack structure including TiAlC/TiN/W, a stack structure including TiN/TaN/TiAlC/TiN/W, or a stack structure including TiN/TaN/TiN/TiAlC/TiN/W. In the stack structures, a TiAlC layer or a TiN layer may serve as the metal-containing layer for controlling the work function.

In some embodiments, a portion of the second metal-containing layer (e.g., 134 in FIG. 1E) may be left on the gate insulating film 120 and may be used as a metal-containing layer for controlling a work function.

Figure 2A:
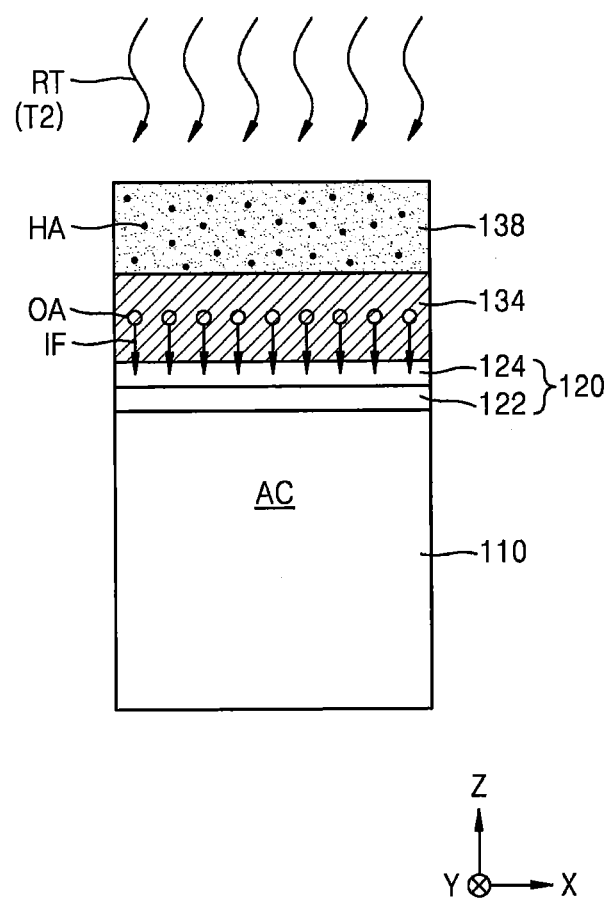
FIGS. 2A and 2B are cross-sectional views illustrating a method of manufacturing a semiconductor device according to example embodiments.
Figure 2B:
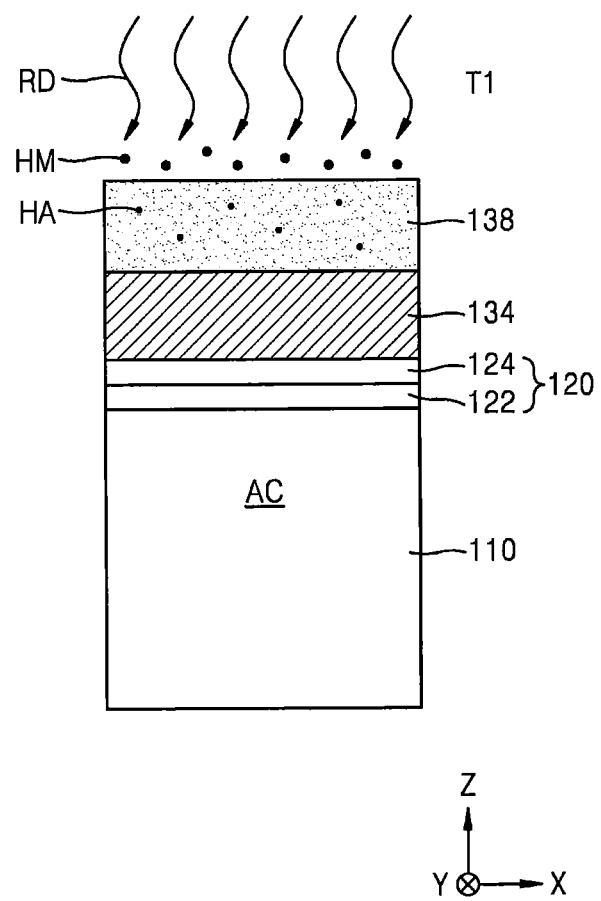

FIGS. 2A and 2B are cross-sectional views illustrating a method of manufacturing a semiconductor device according to example embodiments. FIGS. 2A and 2B are cross-sectional views illustrating process operations that are performed after the process operations shown in FIG. 1C. In FIGS. 2A and 2B, the same reference numerals are used to refer to the same elements in FIGS. 1A to 1G and FIGS. 2A and 2B, and detailed descriptions thereof are omitted.

Referring to FIGS. 1C and 2A, an RTA process may be performed on the substrate 110 on which the silicon capping layer 136 is formed. When heat RT of a second temperature T2 is applied for a second time duration due to the RTA process, the silicon capping layer 136, which is in an amorphous phase, may be changed into a silicon capping layer 138, which is in a polycrystalline phase. The second temperature T2 may range from, for example, about 800° C. to about 1200° C. The second time duration may range from, for example, several seconds to several tens of seconds.

When heat RT of the second temperature T2 is applied, the curing atoms OA contained in the second metal-containing layer 134 may flow (IF) into the gate insulating film 120. In particular, the curing atoms OA may flow (IF) into the high-k dielectric film 124. The curing atoms OA may mostly flow (IF) into the high-k dielectric film 124 and remove defects, such as oxygen vacancy or nitrogen vacancy. It will be understood that those defects in the high-k dielectric film 124 may be partially or entirely removed.

Referring to FIG. 2B, hydrogen atoms HA contained in the silicon capping layer 138 may be at least partially removed in an atmosphere of the first temperature T1. For example, the silicon capping layer 138 may be exposed to UV radiant rays RD for a first time duration in the atmosphere of the first temperature T1 so that hydrogen atoms HA contained in the silicon capping layer 138 may be at least partially removed. The first temperature T1 may be lower than the second temperature (i.e., T2 in FIG. 2A). The first temperature T1 may range from, about 300° C. to about 600° C. The UV radiant rays RD may have a wavelength of, for example, 380 nm or less. The UV radiant rays RD may have a wavelength of, for example, about 280 nm to about 380 nm. The first time duration may be longer than the second time duration. The first time duration may range from, for example, several minutes to several tens of minutes.

Some hydrogen atoms HA contained in the silicon capping layer 138 may be at least partially removed through the RTA process described with reference to FIG. 2A. However, since the RTA process is performed for a relatively short second time duration, only a relatively small number of hydrogen atoms HA contained in the silicon capping layer 138 may be dissociated from silicon or hydrogen molecules HM obtained due to combinations of the dissociated hydrogen atoms HA may not be emitted from the silicon capping layer 136. Accordingly, the silicon capping layer 138 may be exposed in an atmosphere of the first temperature T1 for the first time duration so that a relatively great number of hydrogen atoms HA may be dissociated from silicon and hydrogen molecules HM obtained due to combinations of dissociated hydrogen atoms HA may be emitted from the silicon capping layer 138.

Thereafter, as described above with reference to FIGS. 1F and 1G, after the gate insulating film 120 is exposed by removing the silicon capping layer 138 and the second metal-containing layer 134, a gate electrode 140 may be formed on the gate insulating film 120.

Figure 3A:
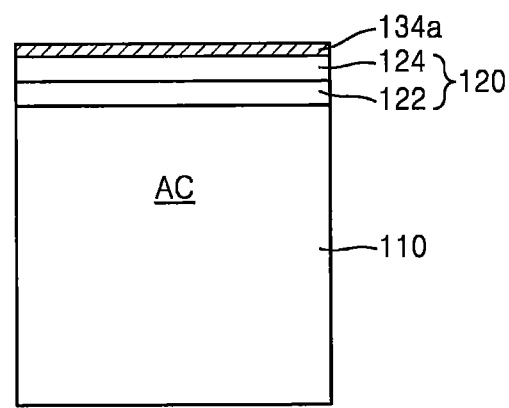
FIGS. 3A and 3B are cross-sectional views illustrating a method of manufacturing a semiconductor device according to example embodiments.
Figure 3A:
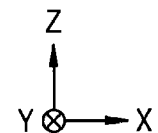
Figure 3B:
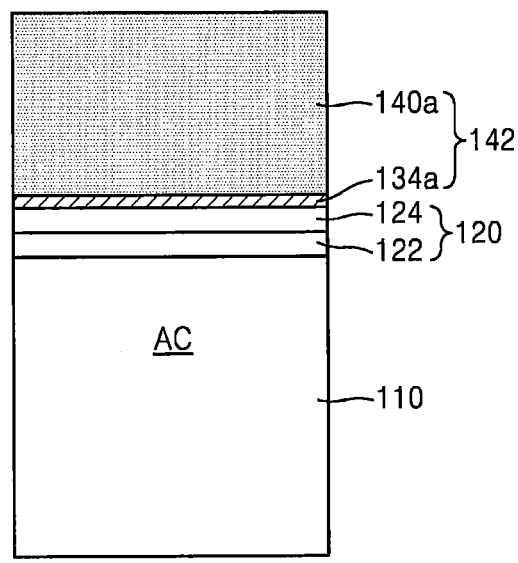
Figure 3B:
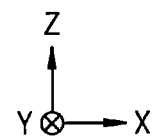

FIGS. 3A and 3B are cross-sectional views illustrating a method of manufacturing a semiconductor device according to example embodiments. FIGS. 3A and 3B are cross-sectional views illustrating process operations that are performed after the process operations shown in FIG. 1E or FIG. 2B. In FIGS. 3A and 3B, the same reference numerals are used to refer to the same elements as in FIGS. 1 to 2B, and detailed descriptions thereof are omitted.

Referring to FIG. 3A, after the silicon capping layer (e.g., 138 in FIG. 1E or FIG. 2B) is removed, a portion of the second metal-containing layer 134 may be removed to leave a portion 134a of the second metal-containing layer 134 on the gate insulating film 120.

Referring to FIG. 3B, a third metal-containing layer 140a may be formed on the portion 134a of the second metal-containing layer 134. Thus, a gate electrode 142 including the portion 134a of the second metal-containing layer 134 and the third metal-containing layer 140a may be formed on the gate insulating film 120.

The third metal layer 140a may include, for example, at least one metal selected from the group consisting of Ti, Ta, Al, W, Ru, Nb, Mo, Hf, Ni, Co, Pt, Yb, Tb, Dy, Er, and Pd, a metal nitride including at least one metal, or a metal compound, such as a carbon-doped metal or a carbon-doped metal nitride.

The third metal layer 140a may include a single layer or a multilayered structure including a plurality of layers. The third metal layer 140a may include, for example, a metal-containing layer for controlling a work function and a gap-fill metal-containing layer filling a space formed on the metal-containing layer for controlling the work function. In some embodiments, a portion 134a of the second metal-containing layer 134 may serve as a metal-containing layer for controlling a work function, and the third metal layer 140a may be a gap-fill metal-containing layer. In some embodiments, the portion 134a of the second metal-containing layer 134 and a portion of the third metal layer 140a may serve as a metal-containing layer for controlling a work function, while the remaining portion of the third metal layer 140a may serve as a gap-fill metal-containing layer.

Figure 4A:
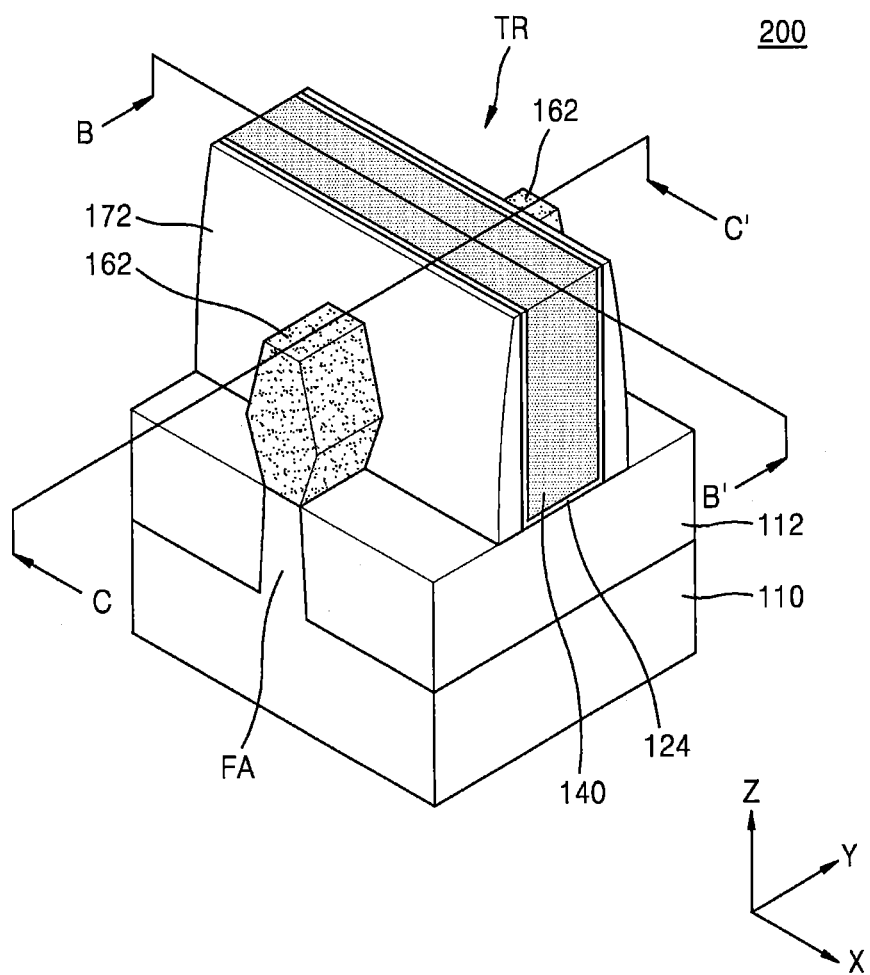
FIGS. 4A through 4E are diagrams illustrating semiconductor devices according to example embodiments.
Figure 4B:
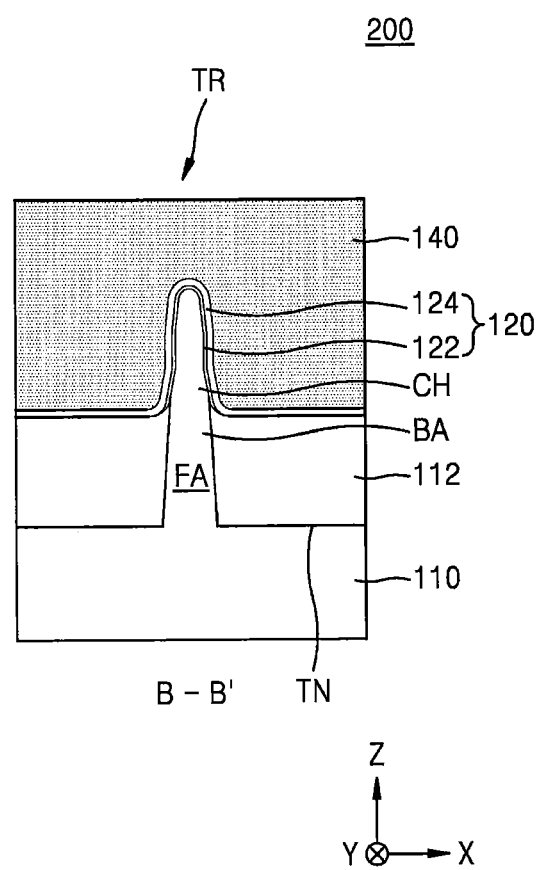
Figure 4C:
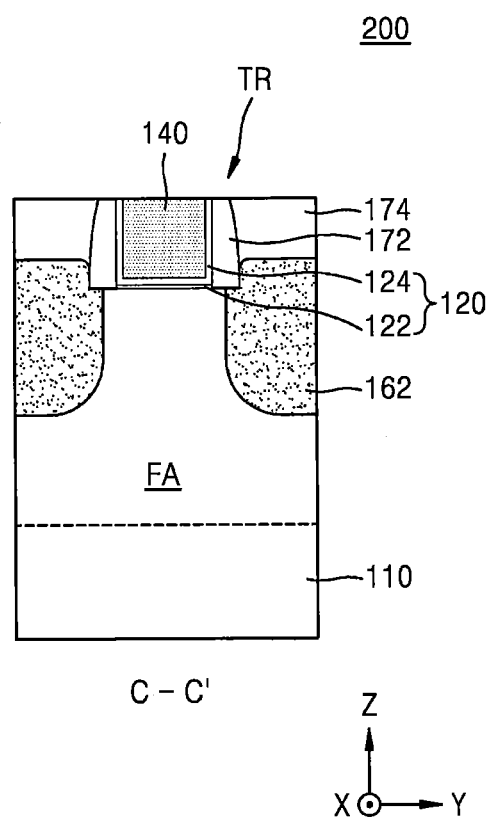
Figure 4D:
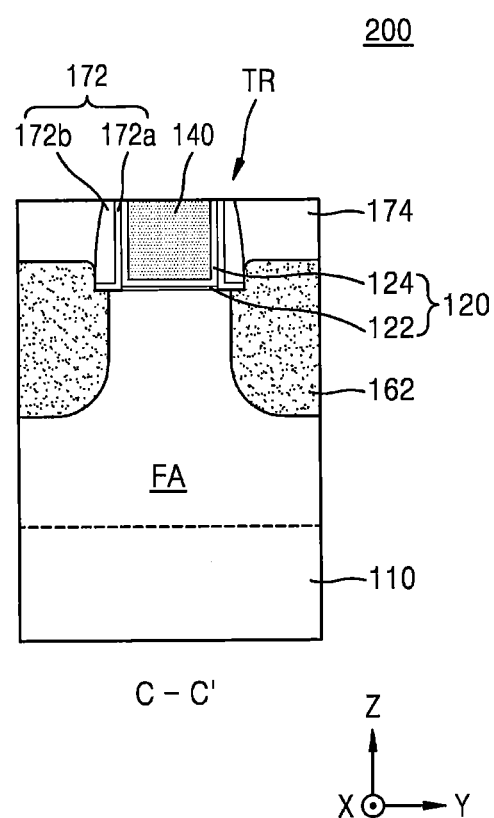
Figure 4E:
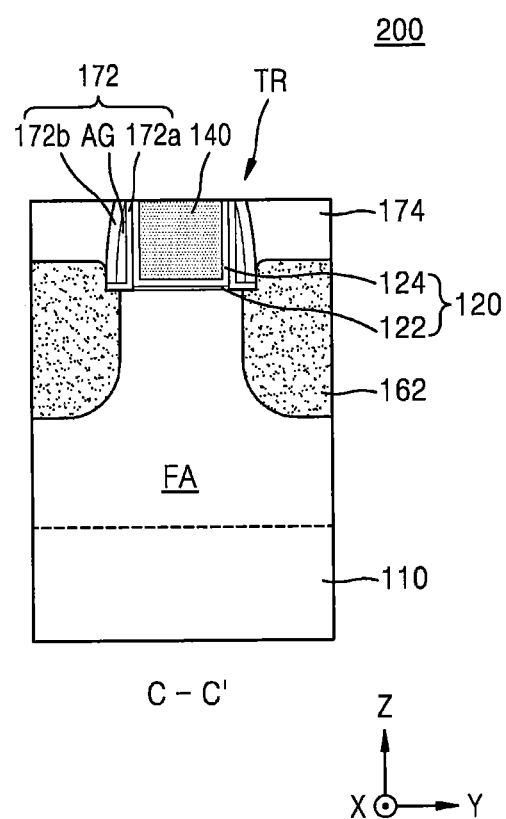

FIGS. 4A to 4E are diagrams illustrating a semiconductor device 200 according to example embodiments. FIG. 4A is a perspective view of a semiconductor device including a transistor having a FinFET structure. FIG. 4B is a cross-sectional view taken along the line B-B' of FIG. 4A. FIGS. 4C, 4D, and 4E are cross-sectional views taken along the line C-C' of FIG. 4A. In FIGS. 4A to 4E, the same reference numerals are used to refer to the same elements as in FIGS. 1 to 2B, and detailed descriptions thereof are omitted.

Referring to FIGS. 4A to 4C, the semiconductor device 200 may include a fin-type active region FA, which may protrude from a substrate 110 in a vertical direction (e.g., Z direction in FIGS. 4A to 4C) perpendicular to a main surface of the substrate 110. The fin-type active region FA may extend in a first direction (e.g., Y direction in FIGS. 4A to 4C). A device isolation film 112 may be formed on the substrate 110 to cover a lower sidewall of the fin-type active region FA. The fin-type active region FA may protrude as a fin type from the device isolation film 112. It will be understood that "an element A covers a surface of an element B" (or similar language) means that the element A is on the surface of the element B but does not necessarily mean that the element A covers the surface of the element B entirely.

The fin-type active region FA may include a channel region CH and a base region BA that is located under the channel region CH and has both sidewalls covered with the device isolation film 112.

In some embodiments, the channel region CH of the fin-type active region FA may include a single material. For example, the entire fin-type active region FA including the channel region CH may include silicon (Si). In some embodiments, a portion of the fin-type active region FA may include germanium (Ge), and a portion of the fin-type active region FA may include silicon (Si).

A top surface and both sidewalls of the fin-type active region FA may be covered with a gate insulating film 120. A gate electrode 140 may be formed on the top surface and both sidewalls of the fin-type active region FA and may cover the gate insulating film 120.

The gate insulating film 120 may include an interface layer 122 and a high-k dielectric film 124. In the semiconductor device 200, the interface layer 122 may be formed between the top surface and both sidewalls of the fin-type active region FA and a bottom surface of the gate electrode 140 and may face the bottom surface of the gate electrode 140, and the high-k dielectric film 124 may face the bottom surface and both sidewalls of the gate electrode 140.

The device isolation film 112 may include a silicon-containing insulating film (e.g., a silicon oxide film, a silicon nitride film, a silicon oxynitride film, and a silicon carbonitride film), poly-Si, or a combination thereof.

A pair of source and drain regions 162 may be formed on both sides of the gate electrode 140 on the fin-type active region FA. The pair of source and drain regions 162 may include a semiconductor layer that may be epitaxially grown on the fin-type active region FA. The source and drain regions 162 may include an embedded silicon-germanium (SiGe) structure including a plurality of epitaxially grown silicon-germanium layers, an epitaxially grown silicon layer, and/or an epitaxially grown silicon carbide (SiC) layer.

Although FIGS. 4A and 4C illustrate the pair of source and drain regions 162 having a specific shape, the inventive concept is not limited thereto. The pair of source and drain regions 162 may have various shapes.

A transistor TR may be formed at an intersection between the fin-type active region FA and the gate electrode 140. The transistor TR may be a MOS transistor having a three-dimensional (3D) structure, which may include a channel formed on a top surface and both side surfaces of the fin-type active region FA. The MOS transistor TR may be an NMOS transistor or a PMOS transistor.

Gate spacer layers 172 may be formed on both sides of a gate structure 120 and 140, which may include the gate insulating film 120 and the gate electrode 140 that are sequentially formed on the surface of the fin-type active region FA. As shown in FIG. 4C, an interlayer insulating film 174 may be formed on opposite sides of the gate structure 120 and 140 and cover the gate spacer layer 172. The gate spacer layer 172 may include, for example, a silicon nitride film, a silicon oxynitride film, or a carbon-containing silicon oxynitride film, or a compound film thereof or include an air gap or a low-k dielectric film, and the interlayer insulating film 174 may include a silicon oxide film, but the inventive concept is not limited thereto.

Referring to FIGS. 4A, 4B, and 4D, the gate spacer layers 172 may include films including L-shaped first insulating spacers 172a and second insulating spacers 172b formed on the first insulating spacers 172a.

In some embodiments, the second insulating spacer 172b may be omitted. In this case, the gate spacer layers 172 may have an L shape.

Referring to FIGS. 4A, 4B, and 4E, the gate spacer layers 172 may include first insulating spacers 172a and second insulating spacers 172b. In some embodiments, each of the first insulating spacers 172a may have an L shape. The gate spacer layers 172 may further include air gaps AG formed between the first insulating spacers 172a and the second insulating spacers 172b.

In some embodiments, the air gaps AG of the gate spacer layers 172 may be filled with a low-k dielectric film having a lower relative dielectric constant than the first and second insulating spacers 172a and 172b.

FIGS. 5 to 16B are cross-sectional views illustrating a method of manufacturing a semiconductor device, for example, a semiconductor device including a FinFET structure, according to example embodiments. A method of manufacturing the semiconductor device 200 shown in FIGS. 4A to 4C according to example embodiments will be described with reference to FIGS. 5 to 16B. Specifically, FIGS. 5, 6, 7, 8A, 9A, and 16A are cross-sectional views taken along the line B-B' of FIG. 4A, and FIGS. 8B, 9B, 10, 11, 12, 13, 14, 15, and 16B are cross-sectional views taken along the line C-C' of FIG. 4A. In FIGS. 5A to 16B, the same reference numerals are used to refer to the same elements as in FIGS. 1 to 4C, and detailed descriptions thereof are omitted.

Figure 5:
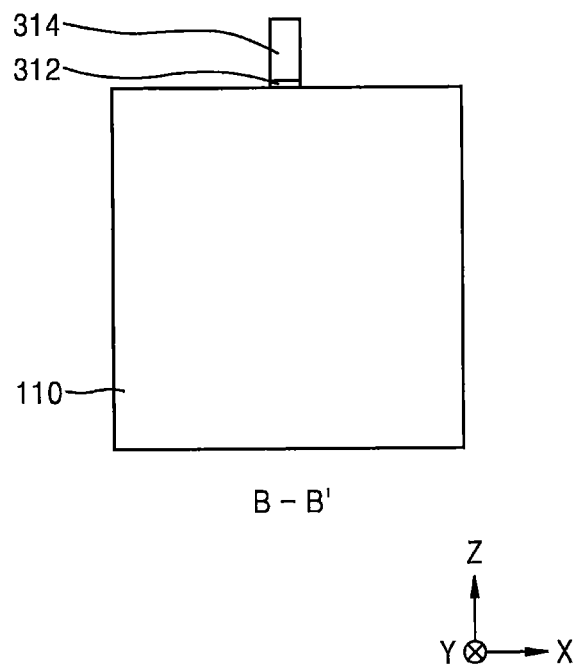
FIGS. 5 through 16B are cross-sectional views illustrating a method of manufacturing a semiconductor device according to example embodiments.

Referring to FIG. 5, a substrate 110 may be prepared, and a pad oxide film pattern 312 and a mask pattern 314 may be formed on the substrate 110.

The pad oxide film pattern 312 and the mask pattern 314 may extend on the substrate 110 in a first direction (e.g., Y direction in FIG. 5).

In some embodiments, the pad oxide layer pattern 312 may include an oxide film obtained by thermally oxidizing the surface of the substrate 110. The mask pattern 314 may include, for example, a silicon nitride film, a silicon oxynitride film, a spin on glass (SOG) film, a spin on hardmask (SOH) film, a photoresist film, or a combination thereof, but the inventive concept is not limited thereto.

Figure 6:
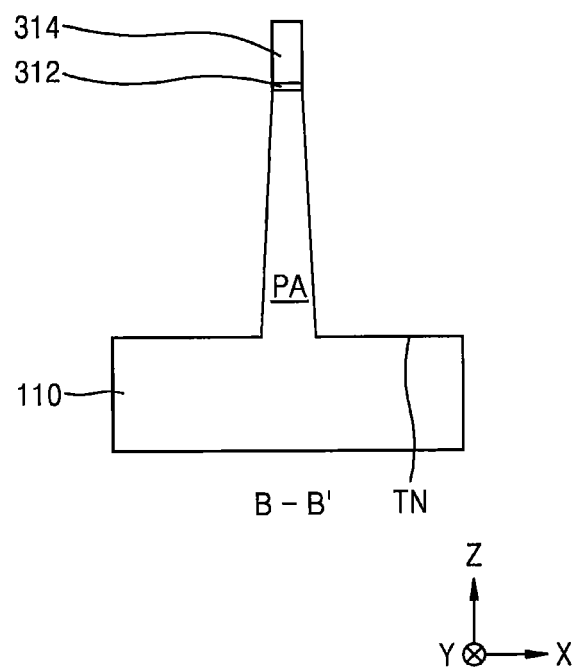

Referring to FIG. 6, a partial region of the substrate 110 may be etched by using the mask pattern 314 as an etch mask so that a trench TN may be formed in the substrate 110. Due to the formation of the trench TN, a preliminary fin-type active region PA may protrude from the substrate 110 in a vertical direction (e.g., Z direction in FIG. 6) that is perpendicular to a main surface of the substrate 110. The preliminary fin-type active region PA may extend in the first direction (e.g., Y direction).

Figure 7:
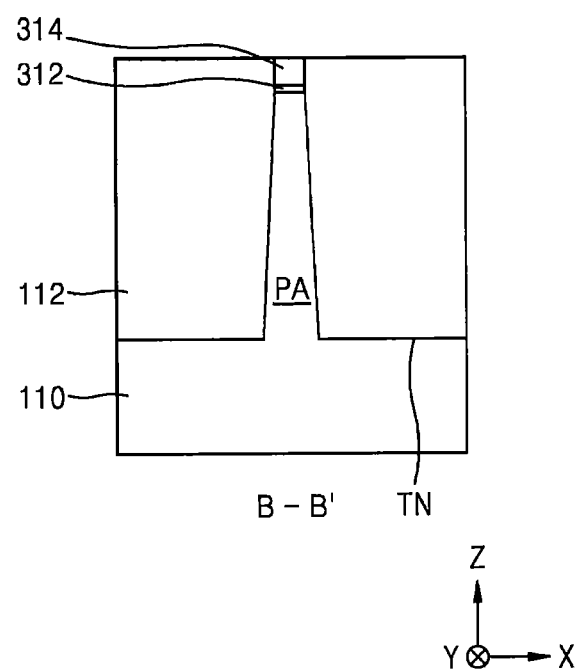

Referring to FIG. 7, a device isolation film 112 may be formed to cover an exposed surface of the preliminary fin-type active region PA and fill the trench TN.

The formation of the device isolation film 112 may be performed by using, for example, a plasma-enhanced chemical vapor deposition (PECVD) process, a high-density plasma (HDP) CVD process, an inductively coupled plasma (ICP) CVD process, a capacitor coupled plasma (CCP) CVD process, a flowable CVD (FCVD) process, and/or a spin coating process, but a method of forming the device isolation film 112 is not limited thereto.

After the device isolation film 112 is formed, a top surface of the device isolation film 112 may be planarized to expose the mask pattern 314. In this case, a portion of the mask pattern 314 may be etched so that heights of the mask pattern 314 and the device isolation film 112 may be reduced.

Figure 8A:
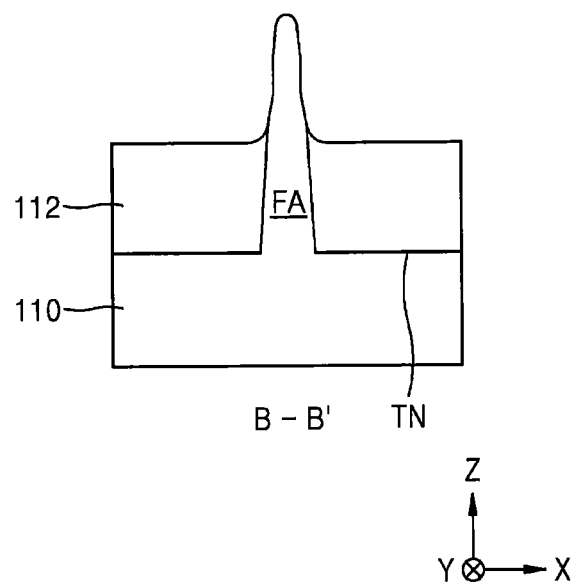
Figure 8B:
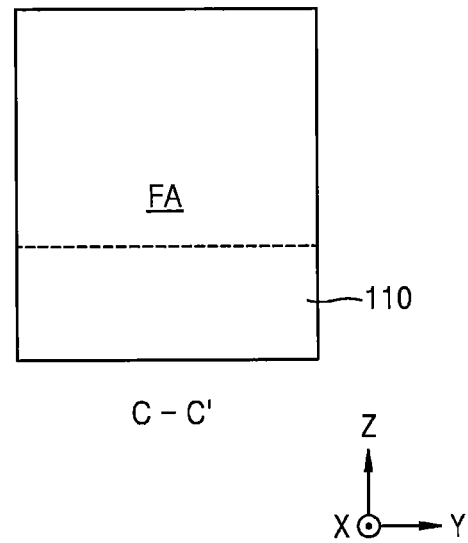

Referring to FIGS. 8A and 8B, a recess process for removing a mask pattern (e.g., 314 in FIG. 7), a pad oxide film pattern (e.g., 312 in FIG. 7) and a portion of the device isolation film 112 may be performed to expose a top surface and upper sidewalls of a preliminary fin-type active region (e.g., PA in FIG. 7). As a result, a height of the top surface of the device isolation film 112 may be reduced, and a fin-type active region FA may be obtained. During the process of removing the portion of the device isolation film 112, a width of a portion (e.g., CH in FIG. 4B) of the fin-type active region FA exposed on the top surface of the device isolation film 112 in a second direction (e.g., X direction in FIG. 8A) may be less than a width of the preliminary fin-type active region PA in the second direction.

The recess process may be performed by using a dry etching process, a wet etching process, or a combination thereof.

When the mask pattern 314 includes a silicon nitride film, the removal of the mask pattern 314 may be performed by, for example, a wet etching process using $H_3PO_4$. The removal of the pad oxide film pattern 312 may be performed by, for example, a wet etching process using diluted HF (DHF). The process of recessing the device isolation film 112 may be performed by a wet etching process using $NH_4OH$, tetramethyl ammonium hydroxide (TMAH), or a potassium hydroxide (KOH) solution as an etchant, and/or a dry etching process, such as an inductively coupled plasma (ICP) process, a transformer coupled plasma (TCP) process, an electron cyclotron resonance (ECR) process, or a reactive ion etch (RIE) process. When the device isolation film 112 is recessed by using a dry etching process, a fluorine-containing gas (e.g., $CF_4$), a chlorine-containing gas (e.g., $Cl_2$), and/or HBr may be used, but the inventive concept is not limited thereto.

During the recess process, an upper portion of the exposed fin-type active region FA may be exposed to an etching atmosphere including, for example, plasma. Thus, the etching atmosphere may damage an exposed surface of the fin-type active region FA or deteriorate roughness of the exposed surface of the fin-type active region FA. Accordingly, in some embodiments, to improve the roughness of the exposed surface of the fin-type active region FA, a wet etching process may be performed or a sacrificial oxide film may be formed and removed. During these processes, a width of a portion (e.g., CH in FIG. 4B) of the fin-type active region FA exposed on the top surface of the device isolation film 112 in the second direction (e.g., X direction in FIG. 8A) may be smaller than a width of the preliminary fin-type active region PA in the second direction.

In some embodiments, an ion implantation process for controlling a threshold voltage may be performed on an upper portion of the fin-type active region FA. For example, during the ion implantation process for controlling the threshold voltage, boron (B) ions may be implanted as impurities to form an NMOS transistor, and phosphorus (P) ions or arsenic (As) may be implanted as impurities to form a PMOS transistor. The ion implantation process for controlling the threshold voltage may be performed before or after the process of improving the roughness of the exposed surface of the fin-type active region FA.

Figure 9A:
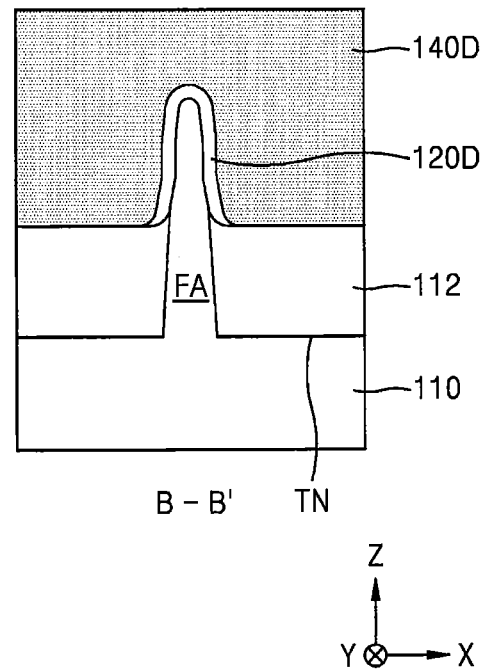
Figure 9B:
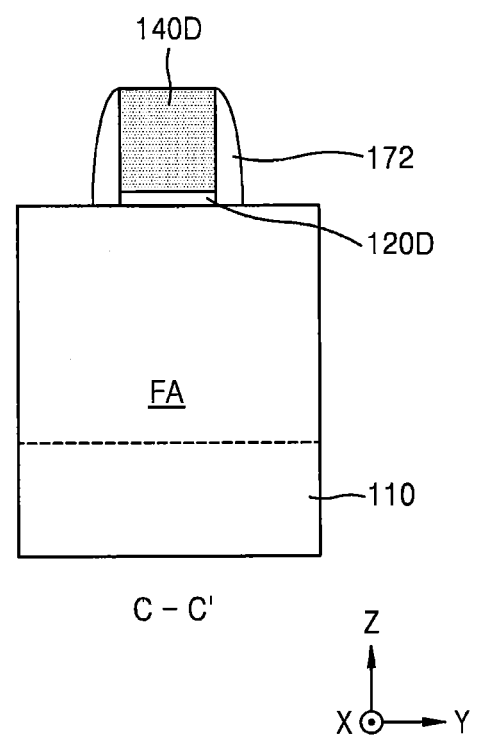

Referring to FIGS. 9A and 9B, a dummy gate insulating film 120D and a dummy gate electrode 140D may be formed on the substrate 110 including the fin-type active region FA. The dummy gate insulating film 120D and the dummy gate electrode 140D may extend in the second direction (e.g., X direction in FIGS. 9A and 9B). The dummy gate insulating film 120D may include, for example, a silicon oxide film, and the dummy gate electrode 140D may include poly-Si, but the inventive concept is not limited thereto.

Thereafter, both sidewalls of the dummy gate insulating film 120D and the dummy gate electrode 140D may be covered with a pair of gate spacer layers 172. The gate spacer layer 172 may include, for example, a silicon nitride film, a silicon oxynitride film, a carbon-containing silicon oxynitride film, or a compound film thereof or include an air gap or a low-k dielectric film, but the inventive concept is not limited thereto.

Figure 10:
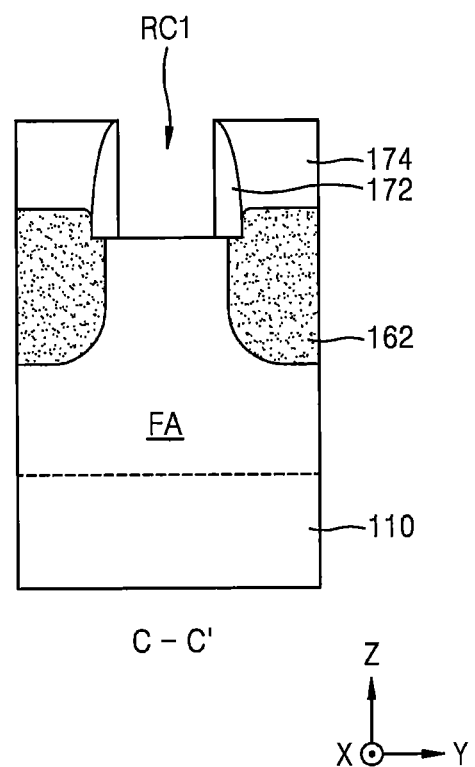

Referring to FIGS. 9A to 10, the dummy gate insulating film 120D and the dummy gate electrode 140D may be removed so that a first recess space RC1 may be defined between a pair of gate spacer layers 172.

A pair of source and drain regions 162 may be formed in both sides of a protrusion of the fin-type active region FA. The pair of source and drain regions 162 may include a semiconductor layer that may be epitaxially grown on the fin-type active region FA. The source and drain regions 162 may include an embedded silicon-germanium structure including a plurality of epitaxially grown silicon germanium layers, an epitaxially grown silicon layer, and/or an epitaxially grown silicon carbide layer.

An interlayer insulating film 174 may be formed on opposite sides of the first recess space RC1 on the gate spacer layer 172 and cover the gate spacer layer 172. The interlayer insulating film 174 may include, for example, a silicon oxide film, but the inventive concept is not limited thereto.

Figure 11:
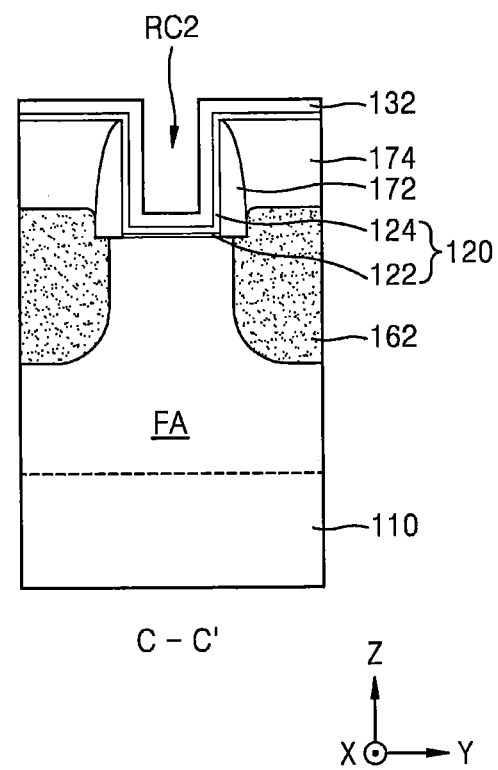

Referring to FIGS. 1A, 10, and 11, a gate insulating film 120 and a first metal-containing layer 132 may be formed to cover an inner surface of the first recess space RC1 and define a second recess space RC2 in the first recess space RC1. The gate insulating film 120 may include an interface layer 122 and a high-k dielectric film 124. The interface layer 122 may cover the surface of the fin-type active region FA exposed by the first recess space RC1. The high-k dielectric film 124 and the first metal-containing layer 132 may extend from a top surface of the interface layer 122 onto the surface of the gate spacer layer 172 exposed by the first recess space RC1. The high-k dielectric film 124 and the first metal-containing layer 132 may also cover a top surface of the interlayer insulating film 174. In some embodiments, similar to the high-k dielectric film 124 and the first metal-containing layer 132, the interface layer 122 may extend on the gate spacer layer 172 and the interlayer insulating film 174.

The interface layer 122 may include, for example, a dielectric layer having a relative dielectric constant of about 9 or less, for example, silicon oxide, silicon nitride, silicon oxynitride, gallium oxide, or germanium oxide, but the inventive concept is not limited thereto. The interface layer 122 may include an oxide, a nitride, or an oxynitride of a material included in the substrate 110. The interface layer 122 may have a thickness of, for example, about 5 Å to about 20 Å, but the inventive concept is not limited thereto. The interface layer 122 may be formed by using, for example, a thermal oxidation process, an ALD process, a CVD process, or a PVD process.

The high-k dielectric film 124 may include, for example, a material having a higher relative dielectric constant than a silicon oxide film and a silicon nitride film. The high-k dielectric film 124 may be formed by using, for example, an ALD process, a CVD process, or a PVD process. The high-k dielectric film 124 may have a thickness of, for example, about 10 Å to about 40 Å, but the inventive concept is not limited thereto.

The first metal-containing layer 132 may include, for example, a metal, a metal nitride, or a metal carbide. The first metal-containing layer 132 may include a material selected from the group consisting of TiN, TaN, W, TiAlC, TaAlC, TaAl, TiAl, HfAl, Al, Ti, WN, Ru, Mo, and a combination thereof, but the inventive concept is not limited thereto. The first metal-containing layer 132 may have a thickness of about several tens of Å to several hundred Å, but the inventive concept is not limited thereto. For example, the first metal-containing layer 132 may have such a thickness as to define the second recess space RC2.

Figure 12:
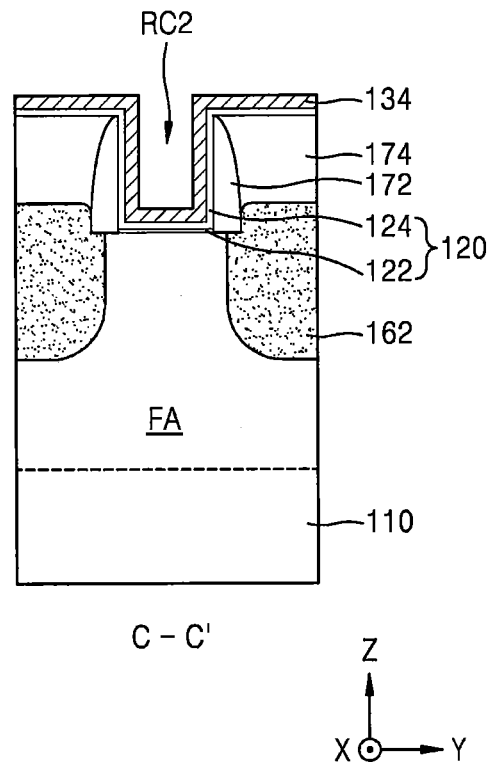

Referring to FIGS. 1B, 11, and 12, the substrate 110 on which the first metal-containing layer 132 is formed may be exposed to an oxygen-containing atmosphere, that is, an atmosphere including oxygen-containing gas molecules OM. The oxygen-containing atmosphere may be, for example, an air atmosphere, a moisture atmosphere, an oxygen atmosphere, or an ozone atmosphere. The oxygen-containing gas molecules OM may be, for example, oxygen molecules, water molecules, or ozone molecules.

At least a portion of the first metal-containing layer 132 exposed to the oxygen-containing atmosphere may be oxidized to form a second metal-containing layer 134 containing oxygen. When the first metal-containing layer 132 includes a metal, a metal nitride, or a metal carbide, the second metal-containing layer 134 may include a metal, a metal nitride, or a metal carbide of which at least a portion is oxidized.

Since the oxygen-containing gas molecules OM are supplied through the second recess space RC2 onto the first metal-containing layer 132 adjacent to the gate insulating film 120 formed on the fin-type active region FA, at least a portion of the second metal-containing layer 134 adjacent to the gate insulating film 120 formed on the fin-type active region FA may contain oxygen.

In some embodiments, when the first metal-containing layer 132 is a metal or a metal carbide, the substrate 110 on which the first metal-containing layer 132 is formed may be exposed to an atmosphere including gas molecules containing nitrogen instead of oxygen. Thus, at least a portion of the first metal-containing layer 132 may be nitrided to form a second metal-containing layer 134 containing nitrogen.

Figure 13:
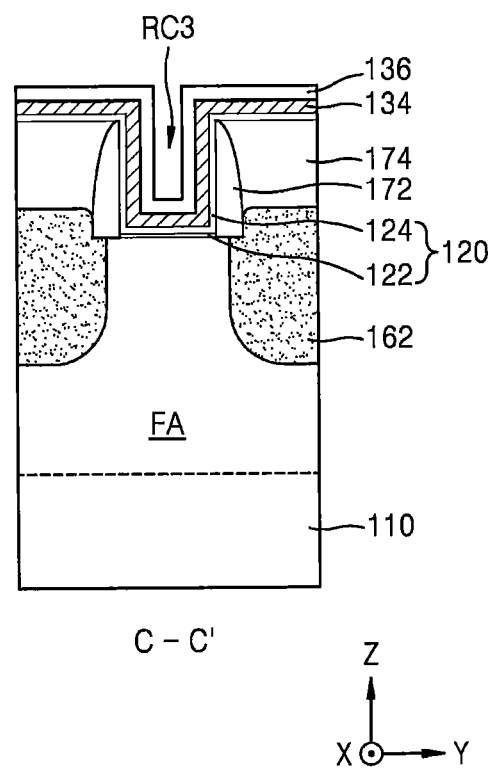

Referring to FIGS. 1C, 12, and 13, a silicon capping layer 136 may be formed on the second metal-containing layer 134. The silicon capping layer 136 may cover an inner surface of the second recess space RC2 and define a third recess space RC3 in the second recess space RC2.

The silicon capping layer 136 may include, for example, a-Si. Hydrogen atoms HA may be contained in the silicon capping layer 136. The silicon capping layer 136 may have a thickness of, for example, several tens of Å to several hundred Å, but the inventive concept is not limited thereto. For example, the silicon capping layer 136 may have such a thickness as to define the third recess space RC3. The silicon capping layer 136 may be formed by, for example, an LPCVD process using a silicon precursor SP containing hydrogen atoms or using both hydrogen molecules H2 and a silicon precursor SP.

Figure 14:
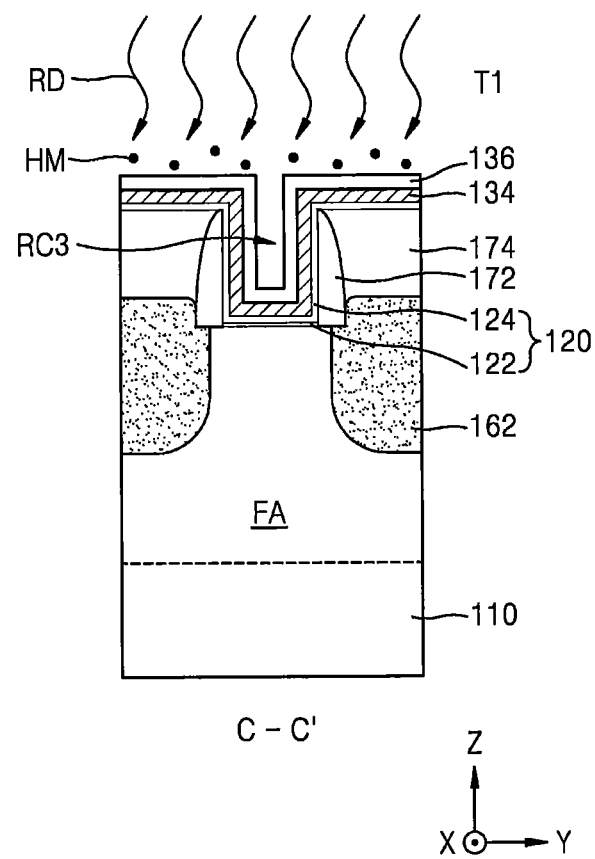

Referring to FIGS. 1D, 13, and 14, the hydrogen atoms HA contained in the silicon capping layer 136 may be at least partially removed in an atmosphere of the first temperature T1. For example, the silicon capping layer 136 may be exposed to UV radiant rays RD in the atmosphere of the first temperature T1 so that the hydrogen atoms HA contained in the silicon capping layer 136 may be at least partially removed. The first temperature T1 may range from, for example, about 300° C. to about 600° C. The UV radiant rays RD may have a wavelength of, for example, 380 nm or less.

When the silicon capping layer 136 is exposed to the UV radiant rays RD for a first time duration of several minutes to several tens of minutes, hydrogen atoms dissociated from silicon may diffuse in an atmosphere of the first temperature T1 and combine with dissociated hydrogen atoms and be emitted as hydrogen molecules HM from the silicon capping layer 136. Thus, hydrogen atoms HA contained in the silicon capping layer 136 may be at least partially removed.

A portion of the silicon capping layer 136 adjacent to the gate insulating film 120 located on the first-type active region FA may also be exposed to the UV radiant rays RD through the third recess space RC3. Thus, hydrogen atoms HA contained in the portion of the silicon capping layer 136 adjacent to the gate insulating film 120 located on the fin-type active region FA may also be at least partially removed.

Figure 15:
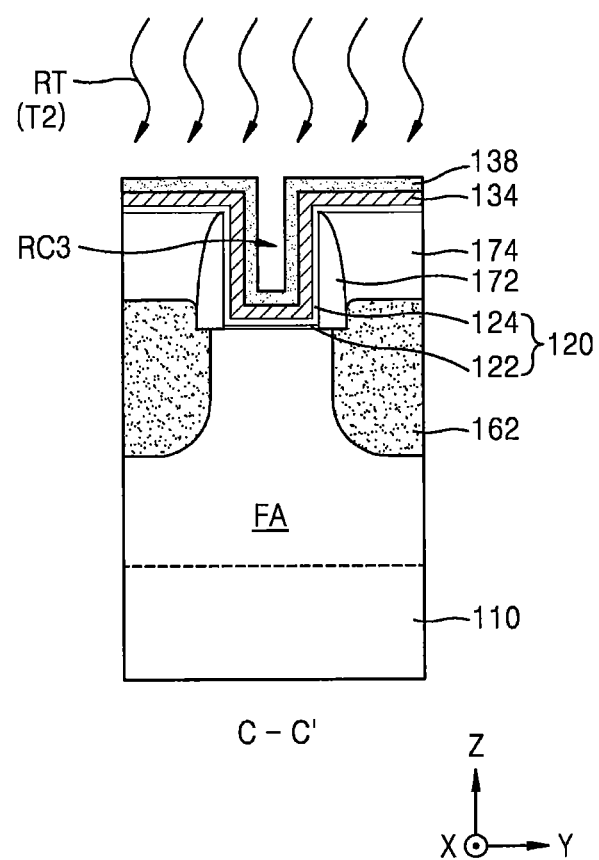

Referring to FIGS. 1E, 14, and 15, a rapid thermal annealing (RTA) process may be performed on the substrate 110 on which the silicon capping layer 136 is formed. For example, when heat RT of the second temperature T2 is applied to the silicon capping layer 136 for a second time duration due to an RTA process, the silicon capping layer 136, which is in an amorphous phase, may be changed into a silicon capping layer 138, which is in a polycrystalline phase. The second temperature T2 may be higher than the first temperature T1. The second temperature T2 may range from, for example, about 800° C. to about 1200° C. The second time duration may be shorter than the first time duration. The second time duration may range from, for example, several seconds to several tens of seconds.

Figure 16A:
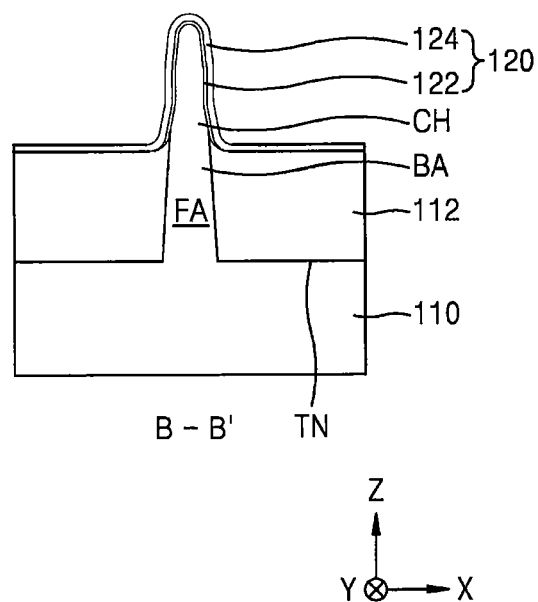
Figure 16B:
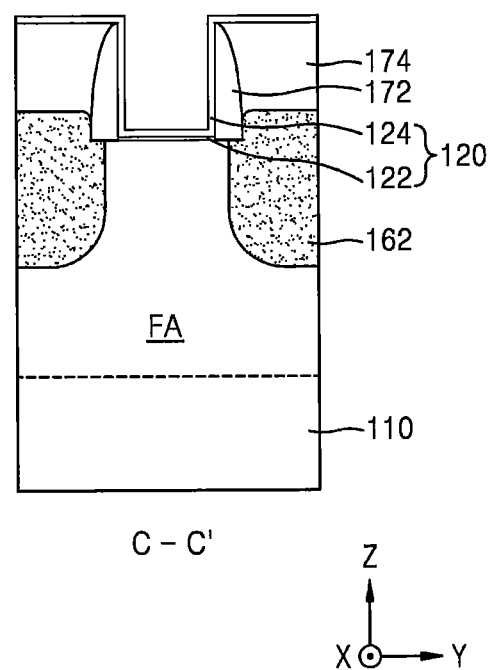

Referring to FIGS. 15, 16A, and 16B, the silicon capping layer 138 and the second metal-containing layer 134 may be removed to expose the gate insulating film 120. The silicon capping layer 138 and the second metal-containing layer 134 may be removed by using, for example, a dry etching process and/or a wet etching process.

As shown in FIGS. 4A to 4C, a gate electrode 140 may be formed on the gate insulating film 120. The gate electrode 140 may be formed by using, for example, an ALD process, a MOALD process, or an MOCVD process.

In some embodiments, unlike described with reference to FIGS. 14 and 15, as described with reference to FIGS. 2A and 2B, after an RTA process is performed, a portion of hydrogen atoms contained in the silicon capping layer 138 may be removed.

In some embodiments, unlike described with reference to FIGS. 16A and 16B, as described with reference to FIGS. 3A and 3B, a portion 134a of the second metal-containing layer 134 may be left on the gate insulating film 120, and a third metal-containing layer 140a may be formed on the portion 134a of the second metal-containing layer 134. Thus, a gate electrode 142 including the portion 134a of the second metal-containing layer 134 and the third metal-containing layer 140a may be formed on the gate insulating film 120.

In a method of manufacturing a semiconductor device according to example embodiments, hydrogen atoms contained in the silicon capping layer (e.g., 136 in FIG. 13) may be at least partially removed to reduce or possibly prevent reliability deterioration of the semiconductor device. Also, occurrence of an unstrip phenomenon of the silicon capping layer (e.g., 138 in FIG. 15) may be reduced or possibly prevented, thus occurrence of failures in the semiconductor device may be reduced or possibly prevented. Although a method of manufacturing a semiconductor device including a FinFET having a 3D channel has been descried with reference to FIGS. 5A to 16B, the inventive concept is not limited thereto. For example, one of ordinary skill in the art will know that semiconductor devices including planar MOSFETs and methods of manufacturing the same, according to the inventive concept, may be provided by making various changes and modifications within the scope of the inventive concept.

Figure 17:
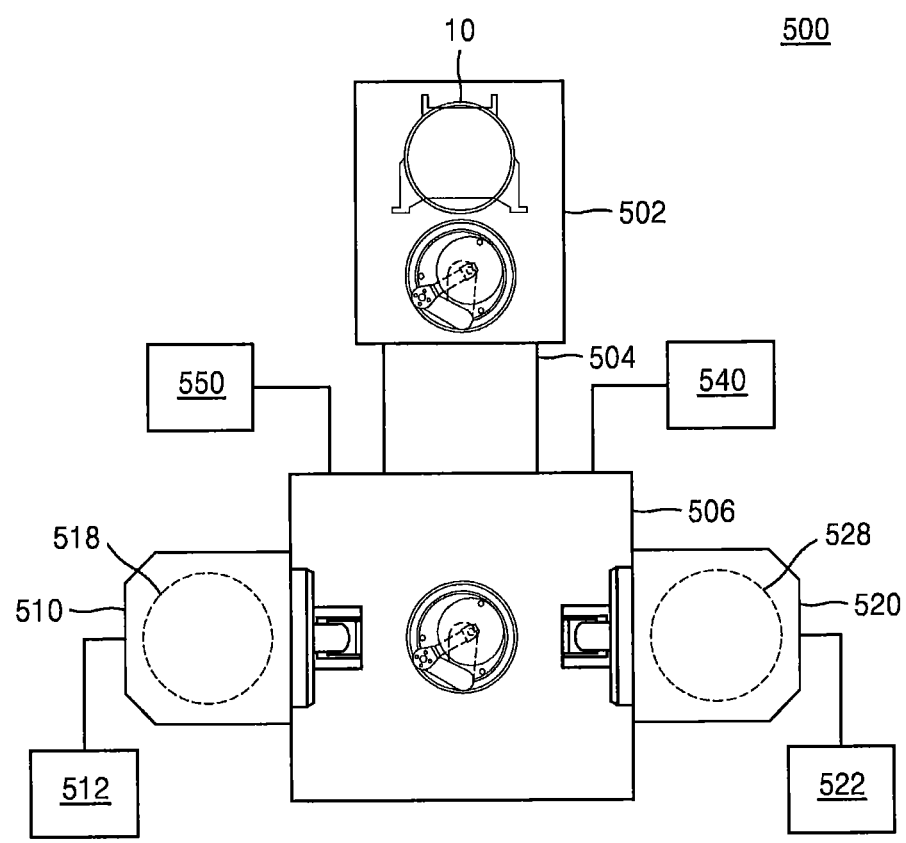
FIG. 17 is a diagram illustrating a process system used for a method of manufacturing a semiconductor device according to example embodiments.

FIG. 17 is a diagram illustrating a process system 500 used for a method of manufacturing a semiconductor device according to example embodiments.

Referring to FIG. 17, the process system 500 used for the method of manufacturing the semiconductor device may include a substrate stage 502, a loadlock chamber 504, a first chamber 510, and a second chamber 520. A cassette 10 containing a substrate may be mounted on the substrate stage 502. Each of the first chamber 510 and the second chamber 520 may be a process chamber. For example, the first chamber 510 may be an LPCVD chamber, and the second chamber 520 may be a UV chamber.

The substrate contained in the cassette 10 mounted on the substrate stage 502 may be transferred to the loadlock chamber 504. The substrate that has been transferred to the loadlock chamber 504 may be transferred to the first chamber 510 or the second chamber 520 through a transfer chamber 506. The substrate that has been transferred to the first chamber 510 or the second chamber 520 may be transferred to the second chamber 520 or the first chamber 510 or transferred to the loadlock chamber 504 through the transfer chamber 506.

The process system 500 may further include a power source unit 540 and a vacuum pump 550. Due to the vacuum pump 550, a vacuum atmosphere may be maintained in the loadlock chamber 504, the transfer chamber 506, the first chamber 510, and the second chamber 520.

The first and second chambers 510 and 520 may include first and second process regions 518 and 528, respectively. Substrates that have been transferred to the first and second chambers 510 and 520 may be located in the first and second process regions 518 and 528, respectively. The first and second chambers 510 and 520 may be connected to first and second sources 512 and 522, respectively. For example, when the first chamber 510 is an LPCVD chamber, the first source 512 may be a gas/precursor supply unit. For example, when the second chamber 520 is a UV chamber, the second source 522 may be a UV radiant ray source. The UV radiant ray source may be, for example, a UV lamp, a UV laser, UV electron beams (e-beams), or another kind of UV radiation device.

Figure 18A:
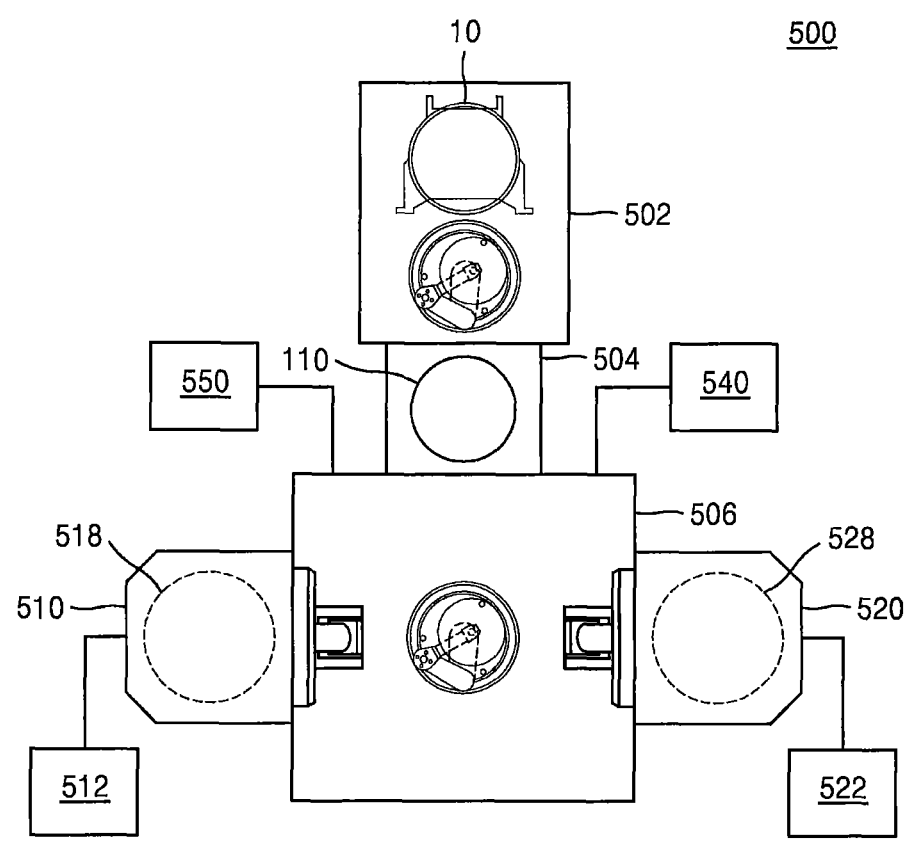
FIGS. 18A through 18C are diagrams illustrating processes of a method of manufacturing a semiconductor device according to example embodiments in the process system of FIG. 17.
Figure 18B:
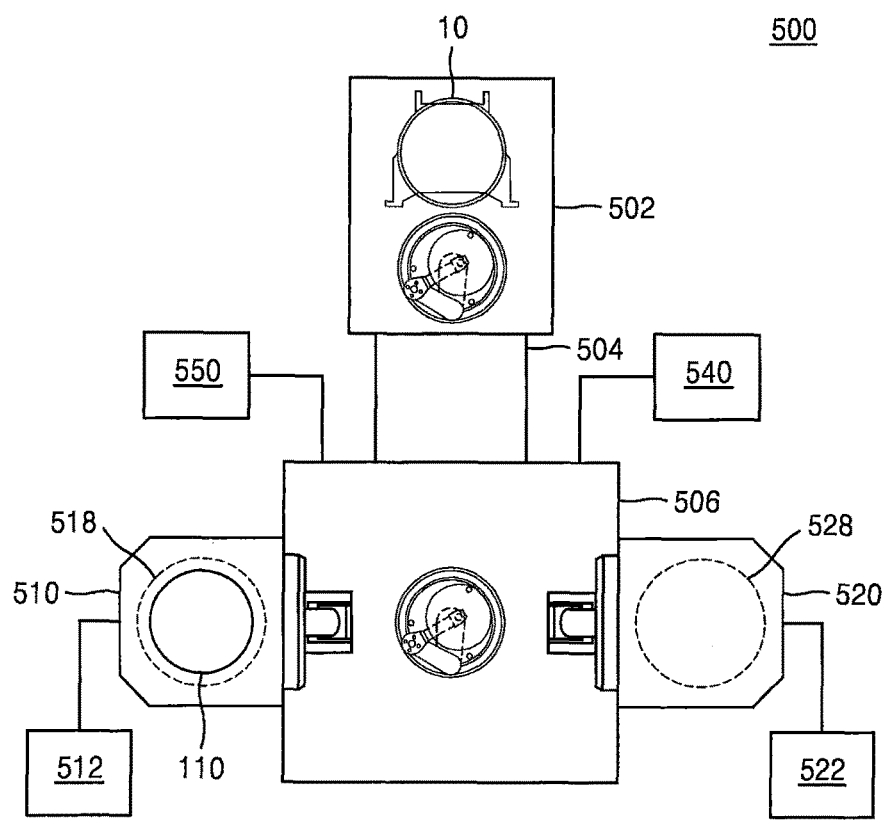
Figure 18C:
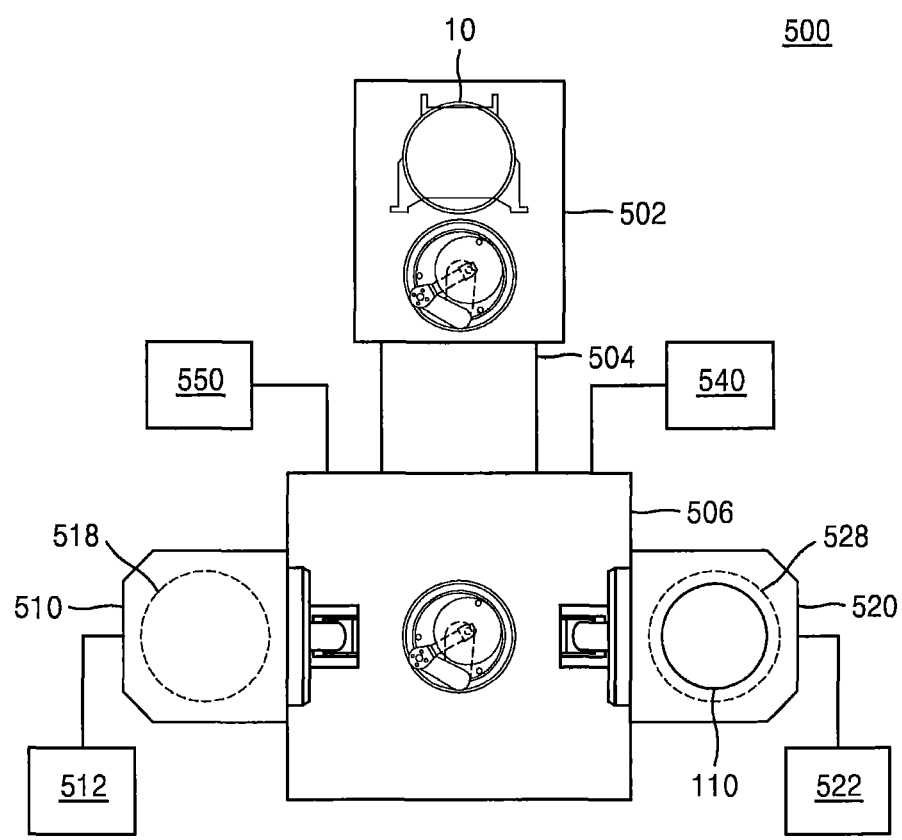

FIGS. 18A to 18C are diagrams illustrating processes of a method of manufacturing a semiconductor device according to example embodiments in the process system 500 of FIG. 17.

Referring to FIG. 18A, a substrate 110 contained in a cassette 10 may be transferred to a loadlock chamber 504 of the process system 500. After the substrate 110 is transferred to the loadlock chamber 504, the loadlock chamber 504 may be isolated from the outside, and a vacuum atmosphere may be formed in the loadlock chamber 504.

Before the substrate 110 is transferred to the process system 500, a gate insulating film (e.g., 120 in FIG. 1A) and a first metal-containing layer (e.g., 132 in FIG. 1A) may be formed on the substrate 110. After the first metal-containing layer 132 is formed on the substrate 110, the substrate 110 on which the first metal-containing layer 132 is formed may be exposed to an oxygen-containing atmosphere. For example, the substrate 110 on which the first metal-containing layer 132 is formed may be exposed to an air atmosphere during the transferring of the substrate 110 to the process system 500. In some embodiments, for example, the substrate 110 on which the first metal-containing layer 132 is formed may be exposed to an additional oxygen-containing atmosphere, such as a moisture atmosphere, an oxygen atmosphere, or an ozone atmosphere. Thus, the substrate 110 on which the gate insulating film 120 and the second metal-containing layer (e.g., 134 in FIG. 1B) containing oxygen may be transferred to the process system 500.

Referring to FIG. 18B, the substrate 110 may be transferred from the loadlock chamber 504 to the first chamber 510 and then may be located in a first process region 518. Since the transfer chamber 506 and the first chamber 510 are maintained in a vacuum atmosphere, after the vacuum atmosphere is provided in the loadlock chamber 504, the substrate 110 may be transferred from the loadlock chamber 504 into the first chamber 510 while the vacuum atmosphere is maintained in the process system 500.

A silicon capping layer (e.g., 136 in FIG. 1C) may be formed on the substrate 110 in the first chamber 510. When the first chamber 510 is an LPCVD chamber, a silicon precursor (e.g., SP in FIG. 1C) containing hydrogen atoms or both hydrogen molecules H2 and a silicon precursor SP may be supplied from a first source 512 to the first process region 518.

Referring to FIG. 18C, the substrate 110 may be transferred from the first chamber 510 to the second chamber 520 and then may be located in a second process region 528. Since the transfer chamber 506, the first chamber 510, and the second chamber 520 are maintained in a vacuum atmosphere, while a vacuum atmosphere is being maintained in the process system 500, the substrate 110 may be transferred from the first chamber 510 to the second chamber 520.

In the second chamber 520, hydrogen atoms HA contained in the silicon capping layer (e.g., 136 in FIG. 1C) located on the substrate 110 may be at least partially removed. When the second chamber 520 is an UV chamber, UV radiant rays (e.g., RD in FIG. 1D) may be supplied from a second source 522 to the second process region 528. In addition, while the substrate 110 located in the second process region 528 is being exposed to the UV radiant rays RD, an atmosphere of a first temperature (e.g., T1 in FIG. 1D) may be provided to the second chamber 520 or the second process region 528.

By exposing the silicon capping layer 136 to the UV radiant rays RD in the atmosphere of the first temperature T1, hydrogen atoms HA contained in the silicon capping layer 136 may be at least partially removed. The first temperature T1 may range from, for example, about 300° C. to about 600° C. The UV radiant rays RD may have a wavelength of, for example, about 380 nm or less. In some embodiments, the UV radiant rays RD may have a wavelength of about 280 nm to about 380 nm.

Thereafter, the substrate 110 may be transferred through the loadlock chamber 504 to outside of the process system 500 and a subsequent process may be performed.

Accordingly, since the silicon capping layer 136 is formed on the substrate 110 and exposed to the UV radiant rays RD in the first and second chambers 510 and 520 of the process system 500 maintained in a vacuum atmosphere, the process of forming the silicon capping layer 136 and the process of exposing the silicon capping layer 136 to the UV radiant rays RD may be performed while maintaining a vacuum atmosphere (i.e., without a vacuum break).

Figure 19:
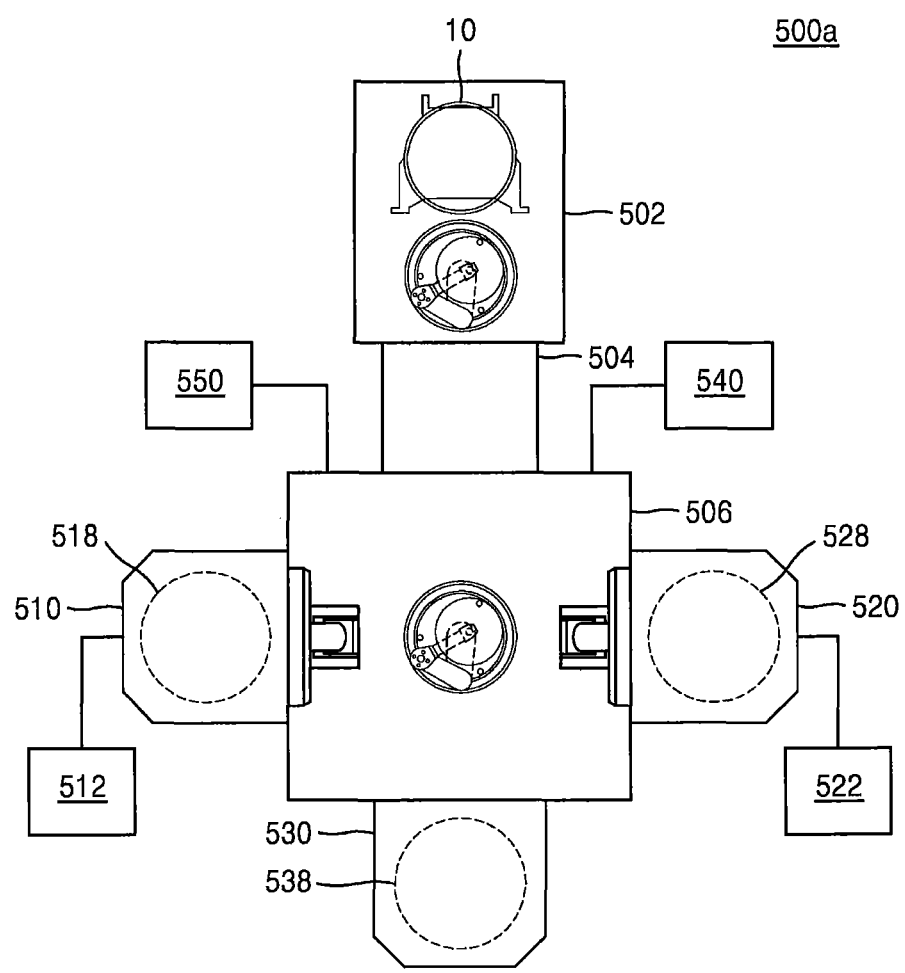
FIG. 19 is a diagram illustrating a process system used for a method of manufacturing a semiconductor device according to example embodiments.

FIG. 19 is a diagram illustrating a process system 500a used for a method of manufacturing a semiconductor device according to example embodiments. In FIG. 19, the same reference numerals are used to refer to the same elements as in FIGS. 17 to 18C, and detailed descriptions thereof are omitted.

Referring to FIG. 19, the process system 500a used for a method of manufacturing the semiconductor device may include a substrate stage 502, a loadlock chamber 504, a first chamber 510, a second chamber 520, and a third chamber 530. Each of the first chamber 510, the second chamber 520, and the third chamber 530) may be a process chamber. For example, the first chamber 510 may be an LPCVD chamber, the second chamber 520 may be a UV chamber, and the third chamber 530 may be an RTA chamber.

As described with reference to FIGS. 18A to 18C, the substrate (e.g., 110 in FIG. 18A) contained in the cassette 10 may be transferred to the loadlock chamber 504 of the process system 500a. After the substrate 110 is transferred to the loadlock chamber 504, the loadlock chamber 504 may be isolated from the outside, and a vacuum atmosphere may be formed in the loadlock chamber 504. After the vacuum atmosphere is formed in the loadlock chamber 504, the substrate 110 may be transferred from the loadlock chamber 504 into the first chamber 510. In the first chamber 510, a silicon capping layer (e.g., 136 in FIG. 1C) may be formed on the substrate 110.

Thereafter, the substrate 110 may be transferred from the first chamber 510 into the second chamber 520 and then located in a second process region 528. In the second chamber 520, hydrogen atoms HA contained in the silicon capping layer (refer to 136 in FIG. 1C) located on the substrate 110 may be at least partially removed.

Thereafter, the substrate 110 may be transferred from the second chamber 520 into the third chamber 530 and then located in a third process region 538. An RTA process may be performed on the substrate 110 in the third chamber 530 as described with reference to FIG. 1E.

Since the transfer chamber 506, the first chamber 510, the second chamber 520, and the third chamber 530 are maintained in a vacuum atmosphere, the substrate 110 may be transferred from the first chamber 510 into the second chamber 520 or transferred from the second chamber 520 into the third chamber 530 while a vacuum atmosphere is maintained in the process system 500a.

Accordingly, the silicon capping layer 136 may be formed on the substrate 110 and may be exposed to the UV radiant rays RD and the RTA process may be performed in the first, second, and third chambers 510, 520, and 530 of the process system 500a maintained in a vacuum atmosphere. Thus, the process of forming the silicon capping layer 136, the process of exposing the silicon capping layer 136 to the UV radiant rays RD, and the RTA process may be performed while maintaining the vacuum atmosphere (i.e., without a vacuum break).

In some embodiments, the substrate 110 may be transferred from the first chamber 510 into the third chamber 530 or transferred from the third chamber 530 into the second chamber 520 in the process system 500a. Thus, as described with reference to FIGS. 2A and 2B, after an RTA process is performed, a process of exposing the silicon capping layer 136 to UV radiant rays RD maybe performed.

Figure 20:
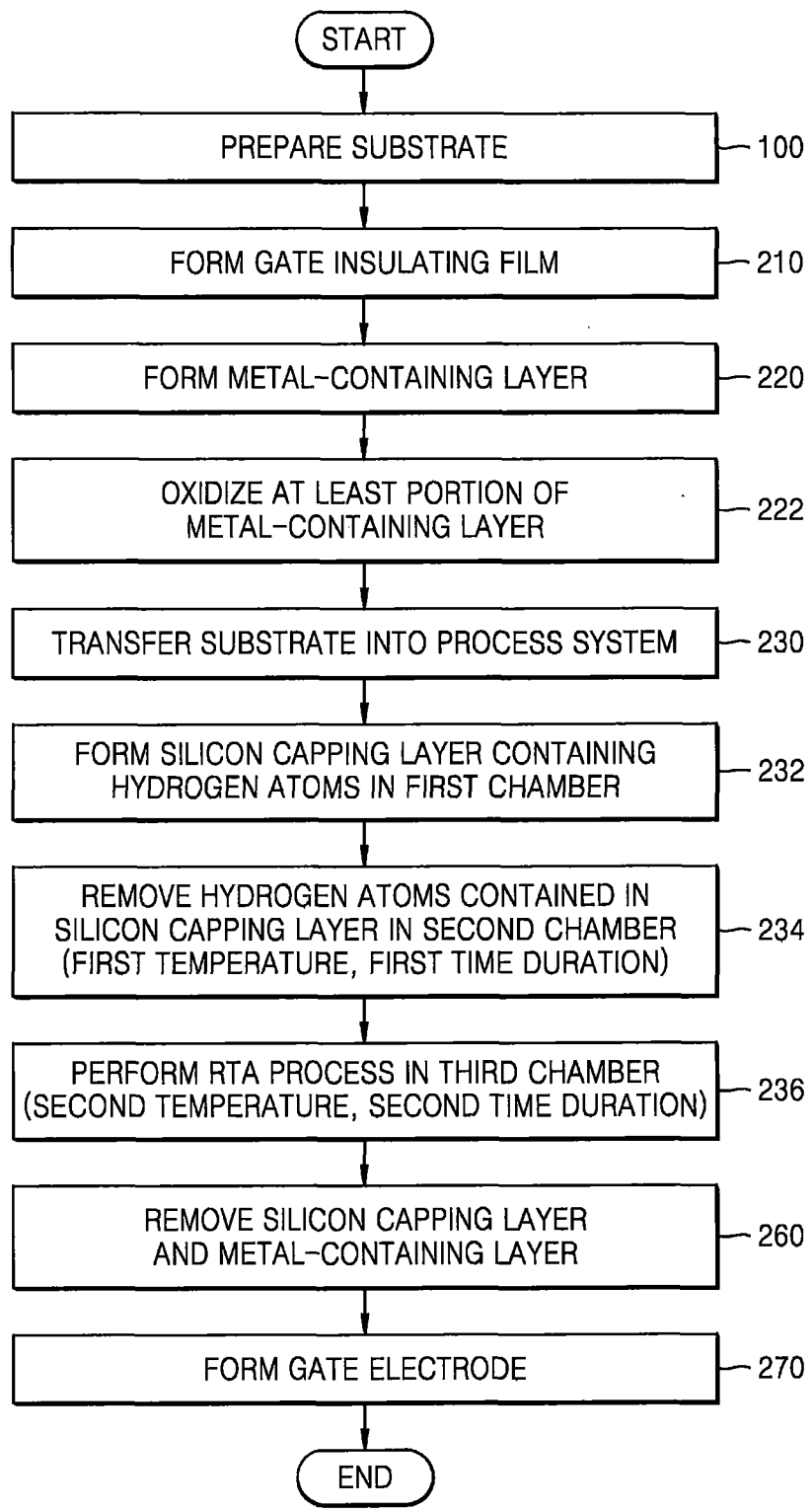
FIG. 20 is a flowchart of a method of manufacturing a semiconductor device according to example embodiments.

FIG. 20 is a flowchart of a method of manufacturing a semiconductor device according to example embodiments.

Specifically, FIG. 20 is a flowchart of the method of manufacturing the semiconductor device described with reference to FIGS. 1A to 1G or FIGS. 3A and 3B, by using the process system described with reference to FIG. 17 or 19.

Referring to FIG. 20 and referring back to FIGS. 1A to 1G, 3A, 3B, 17, and 19, a substrate 110 may be prepared (Block 100), and a gate insulating film 120 may be formed on the substrate 110 (Block 210). Thereafter, a metal-containing layer (e.g., the first metal-containing layer 132 in FIG. 1A) may be formed on the gate insulating film 120 (Block 220). By exposing the metal-containing layer to an oxygen-containing atmosphere, at least a portion of the metal-containing layer may be oxidized to form an oxygen-containing metal-containing layer (e.g., the second metal-containing layer 134 in FIG. 1B) (Block 222).

The substrate 110 on which the metal-containing layer 134 is formed may be transferred to the process system 500 (or 500a) (Block 230). In the process system 500 (or 500a), the substrate 110 may be transferred into the first chamber 510 so that a silicon capping layer 136 containing hydrogen atoms HA may be formed on the substrate 110 (Block 232). Thereafter, the substrate 110 may be transferred from the first chamber 510 into the second chamber 520, and the silicon capping layer 136 may be exposed to UV radiant rays RD for a first time duration at an atmosphere of a first temperature T1 so that the hydrogen atoms HA contained in the silicon capping layer 136 may be at least partially removed (Block 234).

Since the silicon capping layer 136 is formed on the substrate 110 and is exposed to the UV radiant rays RD in the first and second chambers 510 and 520 of the process system 500 (or 500a) maintained in a vacuum atmosphere, the process of forming the silicon capping layer 136 and the process of exposing the silicon capping layer 136 to the UV radiant rays RD may be performed while maintaining a vacuum atmosphere.

The substrate 110 may be transferred from the second chamber 520 into the third chamber 530, and an RTA process may be performed on the substrate 110 by applying heat RT at a second temperature T2 for a second time duration (Block 236).

When the process system 500 shown in FIG. 17 is used, the third chamber 530 may be a chamber included in an additional process system separate from the process system 500.

When the process system 500a shown in FIG. 19 is used, the third chamber 530 may be a chamber included in the process system 500a. In this case, the silicon capping layer 136 may be formed on the substrate 110 and exposed to the UV radiant rays RD and the RTA process may be performed in the first, second, and third chambers 510, 520, and 530 of the process system 500a maintained in a vacuum atmosphere. Thus, the process of forming the silicon capping layer 136, the process of exposing the silicon capping layer 136 to the UV radiant rays RD, and the RTA process may be performed while maintaining the vacuum atmosphere.

The silicon capping layer 138 may be removed, and at least a portion of the metal-containing layer (e.g., the second metal-containing layer 134 in FIG. 1B) may be removed (Block 260). A gate electrode 140 (or 142) may be formed (Block 270).

Figure 21:
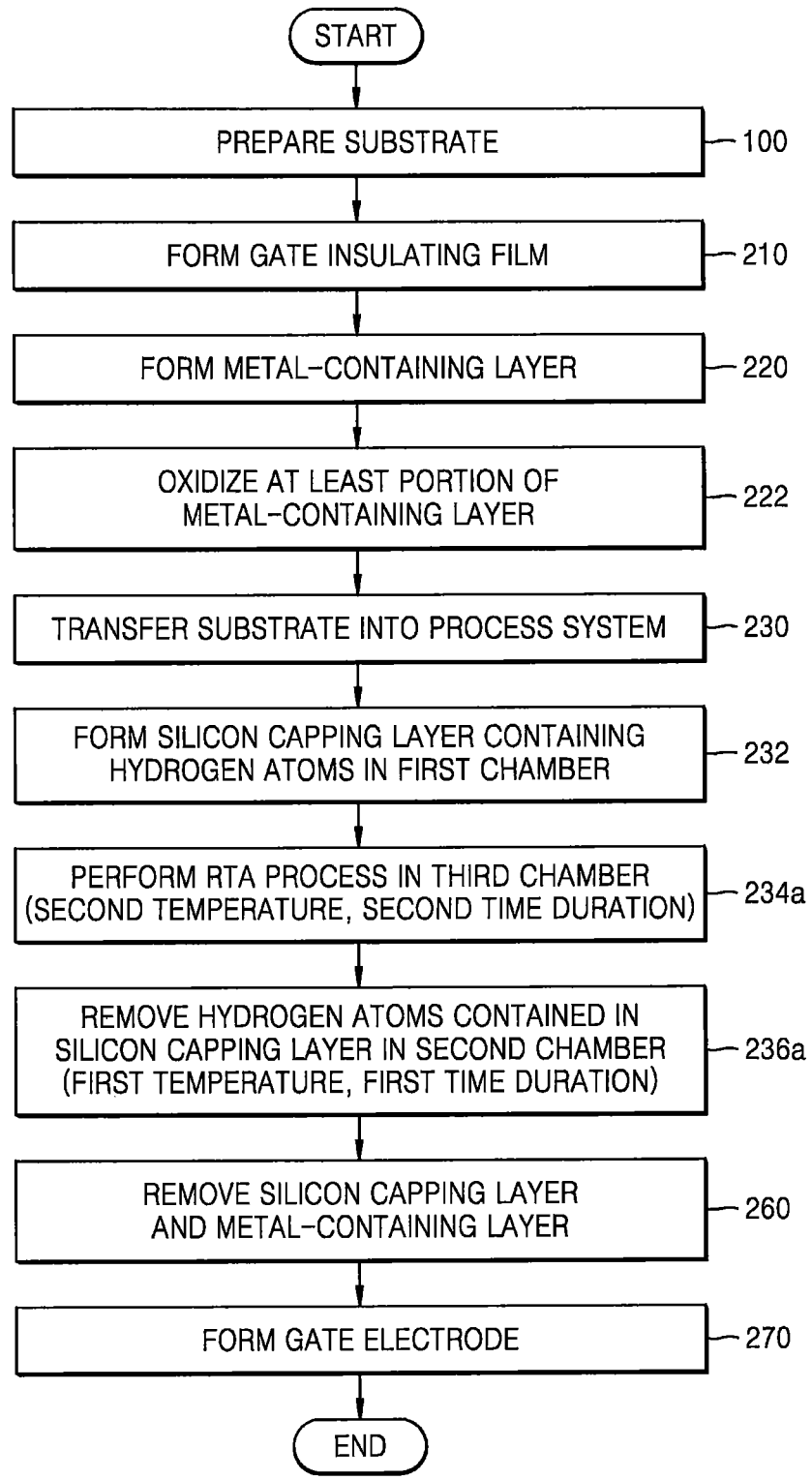
FIG. 21 is a flowchart of a method of manufacturing a semiconductor device according to example embodiments.

FIG. 21 is a flowchart of a method of manufacturing a semiconductor device according to example embodiments. Specifically, FIG. 21 is a flowchart of the method of manufacturing the semiconductor device as described with reference to FIGS. 2A and 2B, by using the process system described with reference to FIG. 19. In FIG. 21, the same reference numerals are used to refer to the same elements as in FIG. 20, and detailed descriptions thereof are omitted.

Referring to FIG. 21 and FIGS. 2A, 2B, and 19, a silicon capping layer 136 containing hydrogen atoms HA may be formed on a substrate 110 in a first chamber 510 of a process system 500a (Block 232). The substrate 110 may be transferred from the first chamber 510 into the third chamber 530, and an RTA process may be performed on the substrate 110 by applying heat RT at a second temperature T2 for a second time duration (Block 234a).

Thereafter, the substrate 110 may be transferred from the third chamber 530 into the second chamber 520, and the silicon capping layer 138 may be exposed to UV radiant rays RD for a first time duration in an atmosphere of a first temperature T1 so that the hydrogen atoms HA contained in the silicon capping layer 138 may be at least partially removed (Block 236a).

The silicon capping layer 136 may be formed on the substrate 110 and may be exposed to the UV radiant rays RD and the RTA process may be performed in the first, second, and third chambers 510, 520, and 530 of the process system 500a maintained in a vacuum atmosphere. Thus, the process of forming the silicon capping layer 136, the process of exposing the silicon capping layer 136 to the UV radiant rays RD, and the RTA process may be performed while maintaining the vacuum atmosphere.

Figure 22:
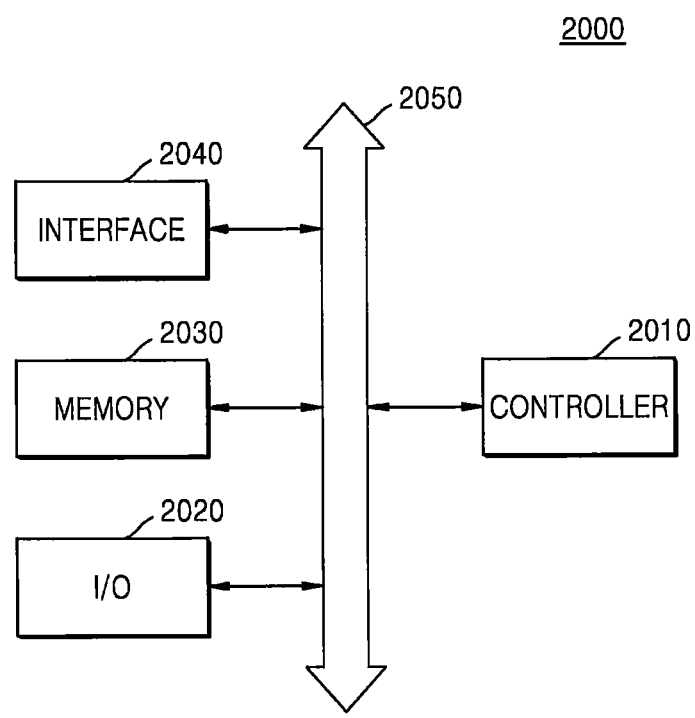
FIG. 22 is a block diagram of an electronic system according to example embodiments.

FIG. 22 is a block diagram of an electronic system 2000 according to example embodiments.

Referring to FIG. 22, the electronic system 2000 may include a controller 2010, an input/output (I/O) device 2020, a memory 2030, and an interface 2040, which may be connected to one another via a bus 2050.

The controller 2010 may include at least one of a microprocessor (MP), a digital signal processor (DSP), or a processor similar thereto. The I/O device 2020 may include at least of a keypad, a keyboard, or a display device. The memory 2030 may be used to store commands executed by the controller 2010. For example, the memory 2030 may be used to store user data.

The electronic system 2000 may be a wireless communication device or a device capable of transmitting and/or receiving information. In the electronic system 2000, the interface 2040 may include a wireless interface to transmit/receive data via a wireless communication network. The interface 2040 may include an antenna and/or a wireless transceiver. In some embodiments, the electronic system 2000 may be used for a communication interface protocol for a third-generation communication system, for example, code division multiple access (CDMA), global system for mobile communications (GSM), north American digital cellular (NADC), extended-time division multiple access (E-TDMA), and/or wide-band code division multiple access (WCDMA). The electronic system 2000 may include at least one of semiconductor devices that are manufactured by using a method of manufacturing a semiconductor device according to example embodiments of the inventive concept and various methods that are modified and changed within the scope of the inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a semiconductor device, the method comprising:
   forming a fin-type active region protruding from a substrate;
   forming a gate insulating film on a top surface and both sidewalls of the fin-type active region, the gate insulating film including a high-k dielectric film;
   forming a metal-containing layer on the gate insulating film;
   forming a silicon capping layer including hydrogen atoms on the metal-containing layer;
   removing a portion of the hydrogen atoms in the silicon capping layer from the silicon capping layer;
   removing the silicon capping layer and at least a portion of the metal-containing layer; and
   forming a gate electrode on the gate insulating film, the gate electrode extending on the top surface and the both sidewalls of the fin-type active region.

2. The method of claim 1, wherein the removing the portion of the hydrogen atoms in the silicon capping layer comprises exposing the silicon capping layer to ultraviolet (UV) light.

3. The method of claim 2, wherein the forming of the silicon capping layer and the exposing of the silicon capping layer to the UV light are performed while maintaining a vacuum atmosphere.

4. The method of claim 2, wherein the UV light has a wavelength of about 280 nm to about 380 nm.

5. The method of claim 2, wherein the forming of the silicon capping layer comprises forming the silicon capping layer in an amorphous phase, and
   wherein the method further comprises performing a rapid thermal annealing (RTA) process to covert the silicon capping layer in the amorphous phase into the silicon capping layer in a polycrystalline phase after the forming of the silicon capping layer.

6. The method of claim 5, wherein the RTA process is performed before or after the silicon capping layer is exposed to the UV light.

7. The method of claim 5, wherein the exposing of the silicon capping layer to the UV light is performed in an atmosphere of a first temperature, and
   wherein the performing of the RTA process comprises applying heat to the substrate at a second temperature higher than the first temperature.

8. The method of claim 7, wherein the first temperature ranges from about 300° C. to about 600° C.

9. The method of claim 7, wherein the second temperature ranges from about 800° C. to about 1200° C.

10. The method of claim 7, wherein the exposing of the silicon capping layer to the UV light is performed for a first time duration, and
    wherein the performing of the RTA process comprises performing a thermal treatment for a second time duration that is shorter than the first time duration.

11. The method of claim 5, wherein the forming of the silicon capping layer, the exposing of the silicon capping layer to the UV light, and the RTA process are performed while maintaining a vacuum atmosphere.

12. The method of claim 5, further comprising exposing the metal-containing layer to an oxygen-containing atmosphere to oxidize at least a portion of the metal-containing layer before the forming of the silicon capping layer.

13. A method of manufacturing a semiconductor device, the method comprising:
    forming a gate insulating film on a substrate, the gate insulating film including a high-k dielectric film;
    forming a metal layer on the gate insulating film, the metal layer including oxygen or nitrogen;
    forming a capping layer on the metal layer;
    performing an anneal process to diffuse a portion of the oxygen or a portion of the nitrogen in the metal layer into the high-k dielectric film; and
    forming a gate electrode on the gate insulating film after performing the anneal process,
    wherein forming the metal layer comprises:
        forming a preliminary metal layer on the gate insulating film; and
        exposing the preliminary metal layer to oxygen or nitrogen to form the metal layer including the oxygen or the nitrogen.

14. The method of claim 13, wherein the capping layer comprises hydrogen, and
    wherein the method further comprises at least partially removing the hydrogen in the capping layer before or after performing the anneal process.

15. The method of claim 14, wherein at least partially removing the hydrogen in the capping layer comprises exposing the capping layer to UV light.

16. The method of claim 15, wherein exposing the capping layer to the UV light is performed at a temperature that ranges from about 300° C. to about 600° C.

17. A method of manufacturing a semiconductor device, the method comprising:
    forming a gate insulating film on a substrate, the gate insulating film including a high-k dielectric film;
    forming a metal layer on the gate insulating film, the metal layer including oxygen or nitrogen;
    forming a capping layer on the metal layer, the capping layer comprising hydrogen;
    performing an anneal process to diffuse a portion of the oxygen or a portion of the nitrogen in the metal layer into the high-k dielectric film;
    at least partially removing the hydrogen in the capping layer before or after performing the anneal process; and
    forming a gate electrode on the gate insulating film after performing the anneal process.

18. The method of claim 17, wherein at least partially removing the hydrogen in the capping layer comprises exposing the capping layer to UV light.

19. The method of claim 18, wherein exposing the capping layer to the UV light is performed at a temperature that ranges from about 300° C. to about 600° C.

20. The method of claim 17, wherein forming the metal layer comprises:
    forming a preliminary metal layer on the gate insulating film; and
    exposing the preliminary metal layer to oxygen or nitrogen to form the metal layer including the oxygen or the nitrogen.

* * * * *